(12) United States Patent
Han et al.

(10) Patent No.: US 11,626,377 B2
(45) Date of Patent: Apr. 11, 2023

(54) SEMICONDUCTOR DEVICE

(71) Applicant: SAMSUNG ELECTRONICS CO., LTD., Suwon-si (KR)

(72) Inventors: Jung-Hoon Han, Hwaseong-si (KR); Dong-Wan Kim, Hwaseong-si (KR); Dongho Kim, Hwaseong-si (KR); Jaewon Seo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/361,588

(22) Filed: Jun. 29, 2021

(65) Prior Publication Data

US 2021/0327839 A1 Oct. 21, 2021

Related U.S. Application Data

(62) Division of application No. 16/418,036, filed on May 21, 2019, now Pat. No. 11,075,181.

(30) Foreign Application Priority Data

Sep. 17, 2018 (KR) .......................... 10-2018-0111016

(51) Int. Cl.
*H01L 23/00* (2006.01)
*H01L 21/66* (2006.01)
*H01L 21/67* (2006.01)

(52) U.S. Cl.
CPC ........ *H01L 24/09* (2013.01); *H01L 21/67253* (2013.01); *H01L 22/32* (2013.01); *H01L 22/34* (2013.01); *H01L 2224/02371* (2013.01)

(58) Field of Classification Search
CPC ... H01L 24/09; H01L 22/32; H01L 21/67253; H01L 22/34; H01L 2224/02371; H01L 21/78

See application file for complete search history.

(56) References Cited

U.S. PATENT DOCUMENTS 6,707,153 B2  3/2004  Kuwabara et al.
7,462,511 B2  12/2008  Yamagata
(Continued)

FOREIGN PATENT DOCUMENTS

EP   3 358 603 A1   8/2018
JP   2005-317866 A  11/2005
(Continued)

*Primary Examiner* — Julia Slutsker
(74) *Attorney, Agent, or Firm* — Lee IP Law, P.C.

(57) ABSTRACT

A semiconductor device includes a semiconductor substrate including a chip region and an edge region around the chip region, a lower insulating layer on the semiconductor substrate, a chip pad on the lower insulating layer on the chip region, an upper insulating layer provided on the lower insulating layer to cover the chip pad, the upper and different insulating layers including different materials, and a redistribution chip pad on the chip region and connected to the chip pad. The upper insulating layer includes a first portion on the chip region having a first thickness, a second portion on the edge region having a second thickness, and a third portion on the edge region, the third portion extending from the second portion, spaced from the first portion, and having a decreasing thickness away from the second portion. The second thickness is smaller than the first thickness.

20 Claims, 34 Drawing Sheets

(56) References Cited

U.S. PATENT DOCUMENTS

| | | |
|---|---|---|
| 7,667,336 B2 | 2/2010 | Ishio |
| 7,994,614 B2 | 8/2011 | Tanaka et al. |
| 8,067,819 B2 | 11/2011 | Yoshida et al. |
| 8,513,808 B2 | 8/2013 | Hotta et al. |
| 9,087,891 B2 | 7/2015 | Yoshizawa et al. |
| 9,607,954 B2 | 3/2017 | Yajima |
| 9,917,011 B2 | 3/2018 | Morishita et al. |
| 2014/0232001 A1 | 8/2014 | Gratz et al. |
| 2015/0364386 A1* | 12/2015 | Yu .................... H01L 25/0657 |
| | | 438/15 |
| 2018/0261467 A1* | 9/2018 | Matsumoto .......... H01L 21/768 |
| 2019/0035750 A1 | 1/2019 | Han et al. |

FOREIGN PATENT DOCUMENTS

| | | |
|---|---|---|
| JP | 2006-228865 A | 8/2006 |
| JP | 2007-27600 A | 2/2007 |
| JP | 2007-103717 A | 4/2007 |
| JP | 2008-047652 A | 2/2008 |
| JP | 2008-053480 A | 3/2008 |
| JP | 2009-239149 A | 10/2009 |
| JP | 2011-071547 A | 4/2011 |
| JP | 2013-077800 A | 4/2013 |
| JP | 2017-034185 A | 2/2017 |
| KR | 10-2018-0059747 A | 6/2018 |
| KR | 10-2019-0012307 A | 2/2019 |
| WO | WO 01/71805 A1 | 9/2001 |
| WO | WO 2017/056297 A1 | 4/2017 |

* cited by examiner

SEMICONDUCTOR DEVICE

CROSS-REFERENCE TO RELATED APPLICATIONS

This is a continuation of U.S. patent application Ser. No. 16/418,036 filed May 21, 2019, which is incorporated by reference herein in its entirety.

Korean Patent Application No. 10-2018-0111016, filed on Sep. 17, 2018, in the Korean Intellectual Property Office, and entitled: "Semiconductor Device," is incorporated by reference herein in its entirety.

BACKGROUND

1. Field

The present disclosure relates to a semiconductor device and, in particular, to a semiconductor device including a redistribution pad.

2. Description of the Related Art

A semiconductor package includes a semiconductor chip, which is configured to store a massive amount of data and process a massive amount of stored data in a short time. The semiconductor chip includes an internal integrated circuit, which is used to store and/or process data, and chip pads, which allows data to be exchanged between the internal integrated circuit and an external device. As the electronic industry advances, there is an increasing demand for a semiconductor device with a high integration density and a high operation speed.

SUMMARY

According to some embodiments, a semiconductor device may include a semiconductor substrate including a chip region and an edge region around the chip region, a lower insulating layer provided on the semiconductor substrate, a chip pad provided on the lower insulating layer on the chip region, an upper insulating layer provided on the lower insulating layer to cover the chip pad, the upper insulating layer including an insulating material different from the lower insulating layer, and a redistribution chip pad on the chip region to penetrate the upper insulating layer and to be connected to the chip pad. The upper insulating layer may include a first portion having a first thickness, on the chip region, a second portion extending from the first portion and on the edge region, the second portion having a second thickness smaller than the first thickness, and a third portion extending from the second portion and spaced apart from the first portion, the third portion having a decreasing thickness in a direction away from the second portion.

According to some embodiments, a semiconductor device may include a semiconductor substrate including a chip region and an edge region around the chip region, a lower insulating layer provided on the semiconductor substrate, a chip pad on the lower insulating layer on the chip region, an upper insulating layer on the lower insulating layer, the upper insulating layer having a first opening exposing the chip pad on the chip region and a second opening exposing a portion of the lower insulating layer on the edge region, and a redistribution chip pad connected to the chip pad, in the first opening. At least a portion of the second opening may have a rounded sidewall.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

Figure 1:
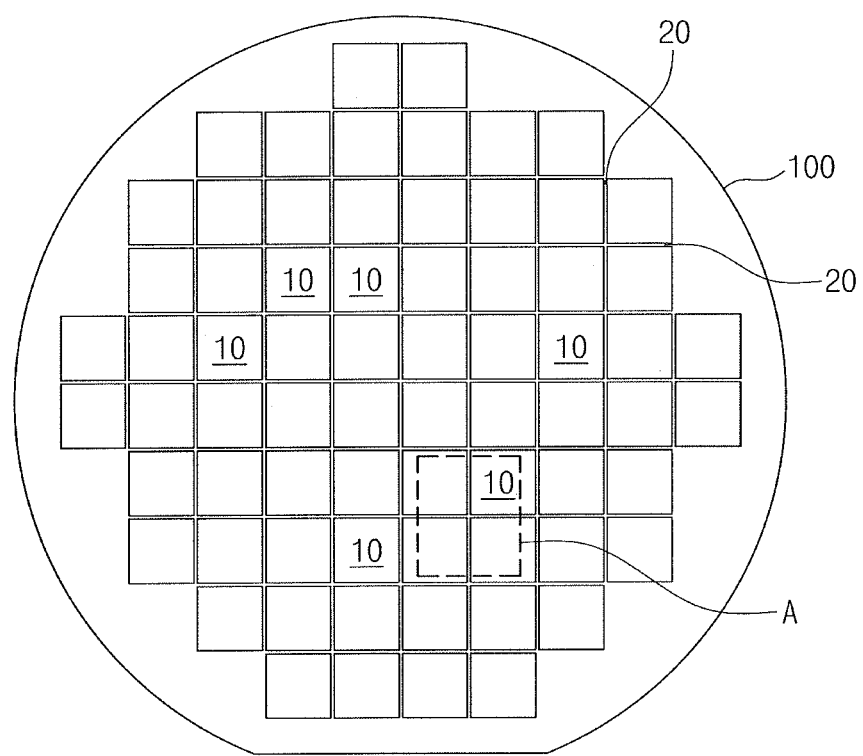
FIG. 1 illustrates a plan view of a substrate including semiconductor devices according to an embodiment.
Figure 2:
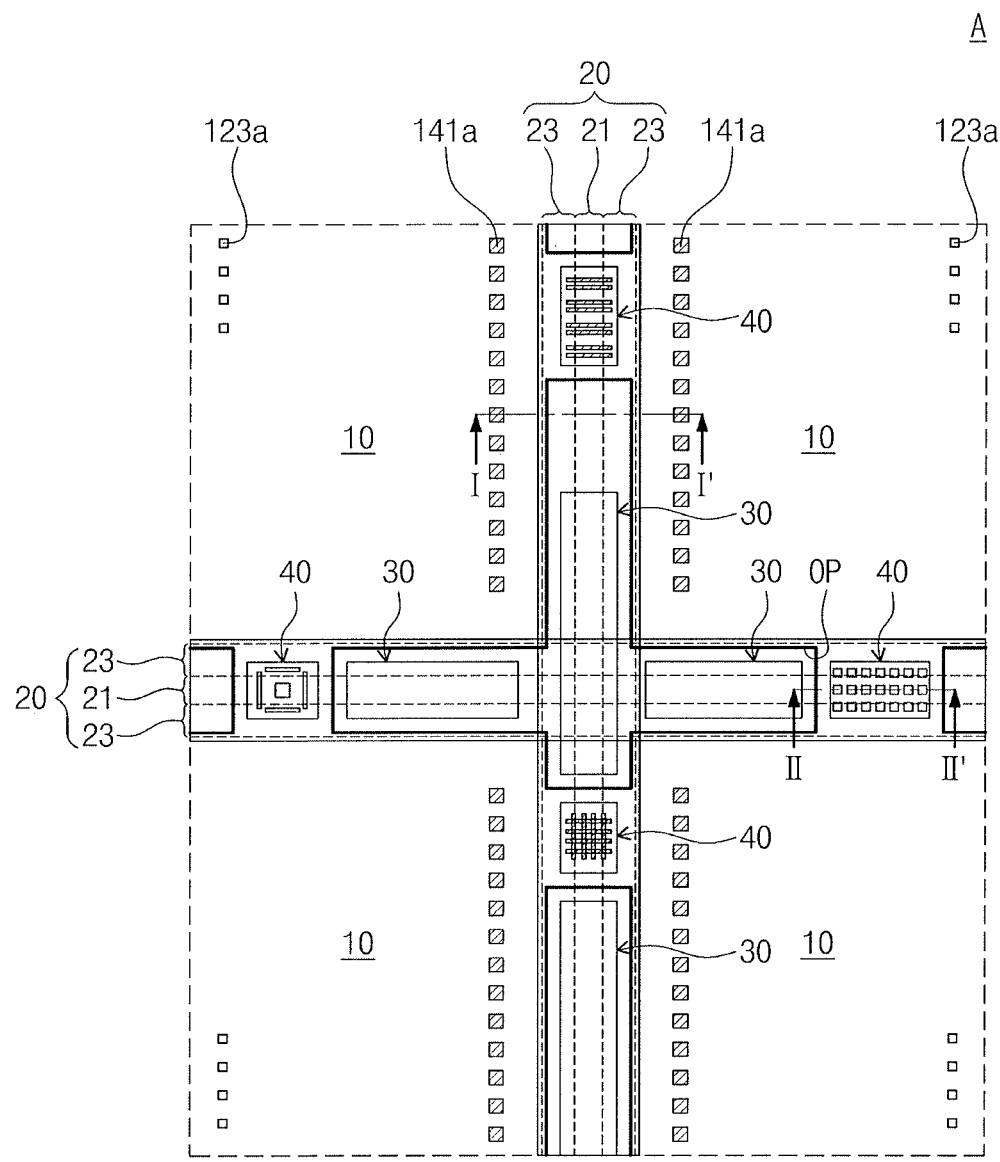
FIG. 2 illustrates an enlarged diagram of a portion 'A' of FIG. 1.
Figure 2:
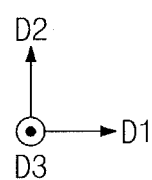

FIG. 1 is a diagram illustrating a semiconductor substrate, on which semiconductor devices according to an embodiment are integrated. FIG. 2 is an enlarged diagram of a portion 'A' of FIG. 1. Referring to FIGS. 1 and 2, a semiconductor substrate 100 may include chip regions 10, on which semiconductor integrated circuits are formed, and a scribe line region 20 between the chip regions 10.

The semiconductor substrate 100 may include at least one of a semiconductor material (e.g., silicon), an insulating material (e.g., glass), a semiconductor or conductive material covered with an insulating material, or the like. For example, the semiconductor substrate 100 may be a silicon wafer, which is of a first conductivity type.

The chip regions 10 may be arranged in a matrix, e.g., two-dimensionally arranged in a first direction D1 and a second direction D2, which are perpendicular to each other. Each of the chip regions 10 may be enclosed by the scribe line region 20.

The scribe line region 20 may include a plurality of first scribe line regions that extend in the first direction D1 and a plurality of second scribe line regions that extend in the second direction D2 to cross the first scribe line regions. The scribe line region 20 may include a cutting region 21, along which the chip regions 10 will be separated, e.g., cut by a sawing or dicing machine, etched, stressed, or the like, along a third direction D3, perpendicular to the first and second directions D1 and D2, and edge regions 23 between the cutting region 21 and the chip regions 10 on both sides of the cutting regions 21. The edge regions 23 may enclose respective chip regions 10 in plan view, e.g., along the first and second directions D1 and D2.

In some embodiments, semiconductor memory devices, e.g., dynamic random access memory (DRAM), static random access memory (SRAM), NAND FLASH memory, resistive random access memory (RRAM), or the like, may be provided on the chip regions 10 of the semiconductor substrate 100. In certain embodiments, a micro-electro mechanical system (MEMS) device, an optoelectronic device, a processor (e.g., CPU or DSP), or the like, may be provided on the chip regions 10 of the semiconductor substrate 100. In certain embodiments, standard cells including semiconductor elements, e.g., OR gate, AND gate, or the like, may be provided on the chip regions 10 of the semiconductor substrate 100. Furthermore, chip pads 123a and redistribution chip pads 141a, which are used to input or output data or signals to or from the semiconductor integrated circuits, may be provided on the chip regions 10 of the semiconductor substrate 100. The chip pads 123a may be provided on an edge or center region of each of the chip regions 10, and the redistribution chip pads 141a may be provided on a region spaced apart from the chip pads 123a along the first and/or second directions D1 and D2.

Test element groups 30 and process monitoring structures 40 may be provided on the scribe line region 20 of the semiconductor substrate 100. The test element groups 30 may include at least one test element having substantially the same structure as at least one of the semiconductor integrated circuits on the chip regions 10, and may be used to evaluate electric characteristics of the semiconductor integrated circuits. The test element groups 30 may include, for example, NMOS FETs, PMOS FETs, resistors, or the like.

The process monitoring structures 40 may include monitoring patterns (e.g., alignment patterns, overlay patterns, measurement patterns, or the like), used to monitor a process for fabricating a semiconductor device. In some embodiments, the alignment patterns may be used for alignment between process steps in the fabrication process and have various shapes, the overlay patterns may be used to examine an overlay between upper and lower patterns, and the measurement patterns may be used to measure a thickness and a line width of a pattern. The process monitoring structures 40 may include process monitoring patterns, which have various shapes depending on their positions.

In some embodiments, an opening OP may be locally formed in an insulating layer on the scribe line region 20. When viewed in a plan view, the opening OP may overlap the test element groups 30, but not with the process monitoring structures 40, along the third direction D3.

Figure 3:
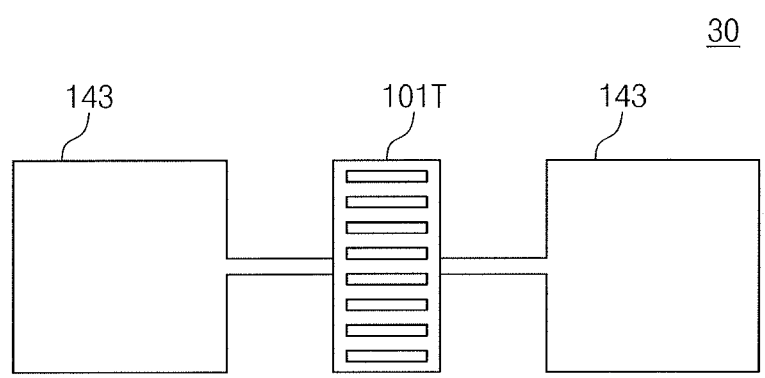
FIG. 3 illustrates a schematic plan view of a test element group of FIG. 2.

FIG. 3 is a plan view schematically illustrating one of the test element groups of FIG. 2. Referring to FIG. 3, each of the test element groups 30 may include a plurality of test structures 101T and a plurality of test pads 143. The test pads 143 may be connected to the test structures 101T through conductive lines. The test structures 101T may include test elements, each of which has substantially the same structure as a corresponding one of the semiconductor integrated circuits formed on the chip region 10. The test structures 101T may include, for example, NMOS FETs, PMOS FETs, resistors, or the like.

Figure 4:
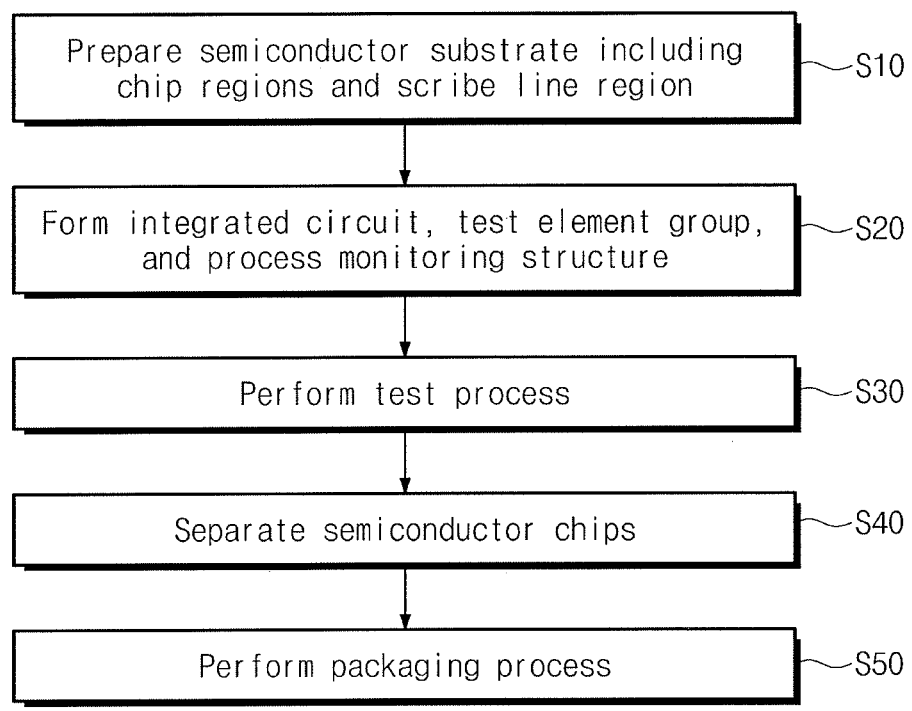
FIG. 4 illustrates a flow chart of a method of fabricating a semiconductor device according to an embodiment.

FIG. 4 is a flow chart illustrating a method of fabricating a semiconductor device according to an embodiment. Referring to FIG. 4, a semiconductor substrate including the chip regions and the scribe line region may be prepared, as previously described with reference to FIGS. 1 and 2 (in S10).

Various processes for fabricating a semiconductor device may be performed on the semiconductor substrate to form the semiconductor integrated circuits, the process monitoring structures, and the test element groups (in S20). In some embodiments, the process monitoring structures may be used to provide process reference for the fabrication processes, and thus, the semiconductor integrated circuits and the test element groups may be formed after the process monitoring structures. In other words, the test element groups may be formed on a remaining area of the scribe line region, which is not occupied by the process monitoring structures, after the formation of the process monitoring structures.

After the formation of the semiconductor integrated circuits and the test element groups, a test process may be performed on the test element groups (in S30). During the test process, electrical signals may be provided to the test element group through test pads to evaluate electric characteristics of the semiconductor integrated circuits.

After the test process, a separation process, e.g., sawing, dicing, or the like, may be performed along the cutting region of the scribe line region. As a result, the chip regions of the semiconductor substrate, on which the semiconductor integrated circuits are formed, may be separated from each other (in S40).

Thereafter, a packaging process may be performed on each of the semiconductor chips, which are separated from each other by the separation process (in S50). The packaging process may include molding the semiconductor chip and forming outer coupling terminals (e.g., bumps) on the semiconductor chip.

FIGS. 5A to 5I are sectional views illustrating stages in a method of fabricating a semiconductor device according to an embodiment, taken along a line I-I' of FIG. 2. FIG. 5J is an enlarged diagram illustrating a portion of an edge region of the semiconductor device of FIG. 5I. FIG. 6 is a sectional view illustrating a portion of a semiconductor device according to an embodiment, taken along a line II-II' of FIG. 2.

Figure 5A:
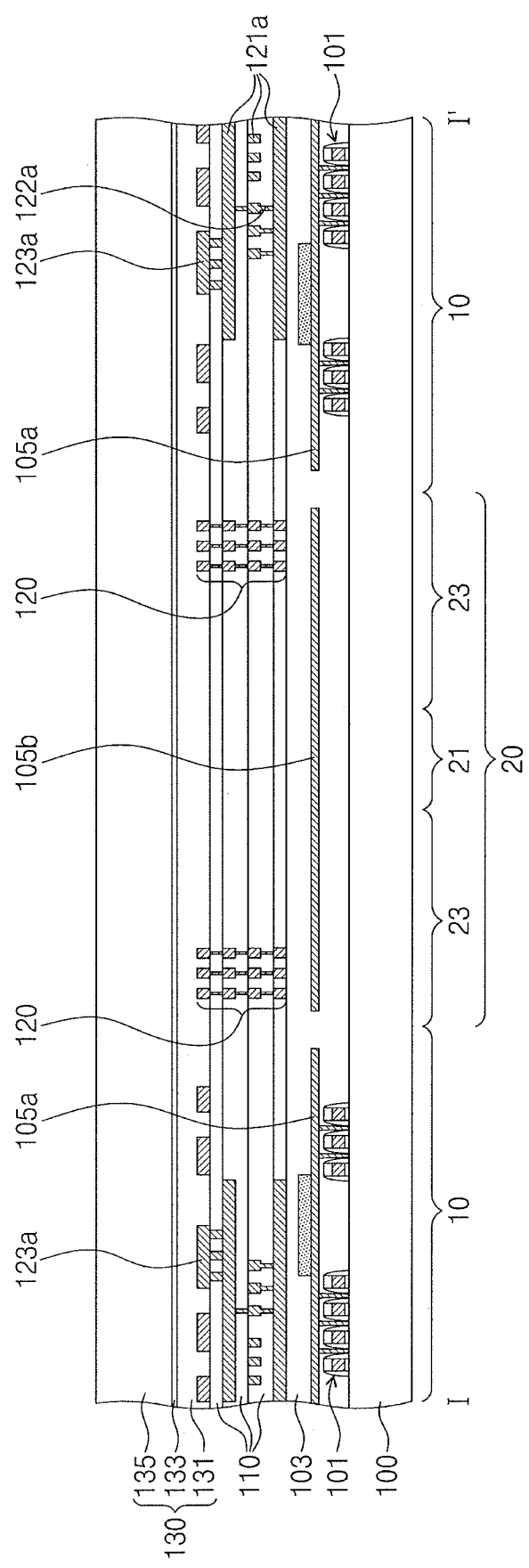
FIGS. 5A to 5I illustrate sectional views of stages in a method of fabricating a semiconductor device according to an embodiment, taken along a line I-I' of FIG. 2.
Figure 6:
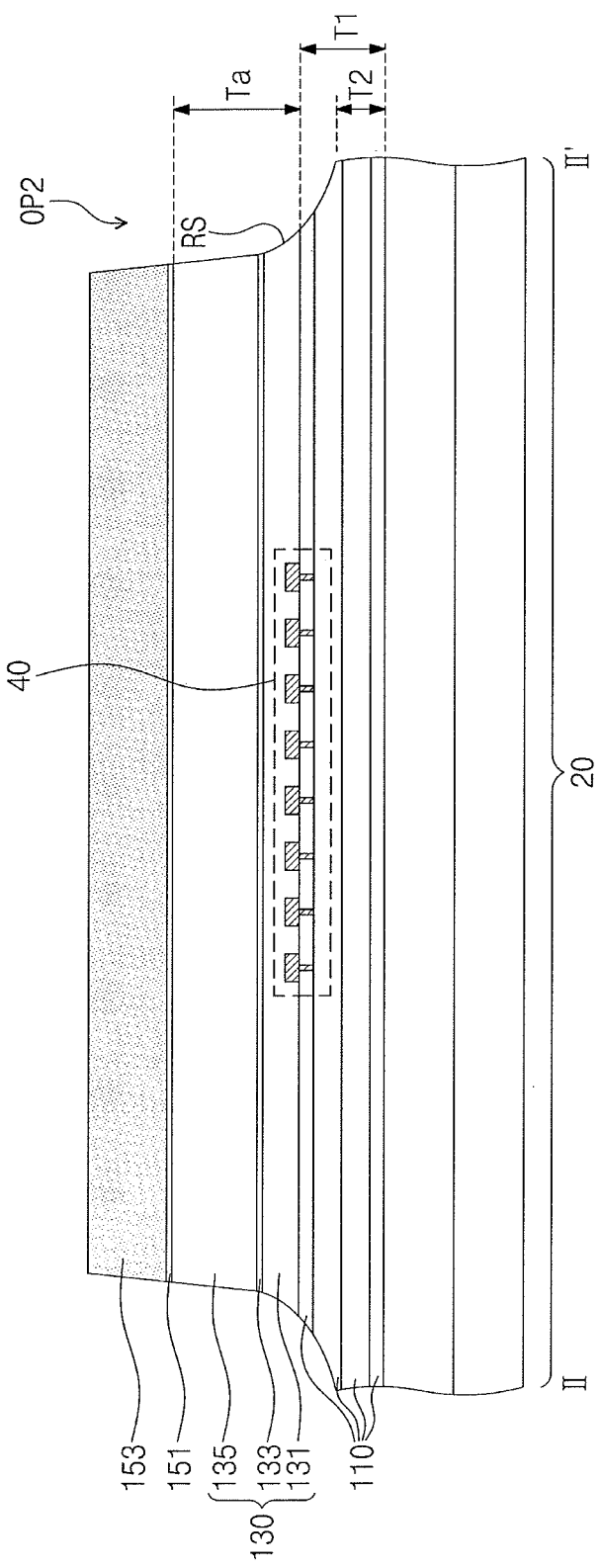
FIG. 6 illustrates a sectional view of a portion of a semiconductor device according to an embodiment, taken along a line of FIG. 2.

Referring to FIGS. 2 and 5A, the semiconductor substrate 100 may include a plurality of the chip regions 10 and a plurality of the scribe line regions 20. Each of the scribe line regions 20 may include the cutting region 21 at a center and edge regions 23 between the cutting region 21 and the chip regions 10 along either side of the cutting region. The scribe line regions 20 may extend in the first direction D1 or the second direction D2. When the scribe line region 20 extends in the first direction D1, the edge regions 23 are spaced from the cutting region 21 along the second direction D2 on both side of the cutting region 21, and vice versa.

A semiconductor integrated circuit 101 may be formed on the chip region 10 of the semiconductor substrate 100. The semiconductor integrated circuit 101 may include a memory cell array, including switching elements, data storage elements, or the like, and logic devices, including MOS FETs, capacitors, resistors, or the like. The semiconductor integrated circuit 101 may be covered with an interlayered insulating layer 103. In an embodiment, the interlayered insulating layer 103 may cover the entire top surface of the semiconductor substrate 100. The interlayered insulating layer 103 may be formed of or include at least one of silicon oxide, silicon nitride, silicon oxynitride, or the like.

Lower interconnection lines 105a, which are connected to the semiconductor integrated circuit 101, may be provided in the interlayered insulating layer 103 and on the chip regions 10. Dummy lower interconnection lines 105b may be provided in the interlayered insulating layer 103 and on the scribe line region 20. The lower interconnection lines 105a and the dummy lower interconnection lines 105b may be formed of or include at least one of metallic material, e.g., tungsten (W), titanium (Ti), tantalum (Ta), Ti nitride (TiN), WN, TaN, or the like.

A lower insulating layer 110 may be formed on the interlayered insulating layer 103 to cover the entire top surface of the semiconductor substrate 100 and may include a plurality of insulating layers stacked on the semiconductor substrate 100 along the third direction D3. In some embodiments, the lower insulating layer 110 may be formed of a low-k dielectric material whose dielectric constant is lower than silicon oxide. The lower insulating layer 110 may have a dielectric constant of about 1.0 to 3.0 and may be formed of or include at least one of organic, inorganic, or organic-inorganic hybrid materials. In certain embodiments, the lower insulating layer 110 may be formed to have a porous structure or a non-porous structure. The lower insulating layer 110 may be formed of at least one of, e.g., impurity-doped silicon oxide materials, low-k organic polymers, or the like. The impurity-doped silicon oxide materials may be, e.g., fluorine-doped oxide (e.g., FSG), carbon-doped oxide, silicon oxide, hydrogen silsesquioxane (HSQ; SiO:H), methyl silsesquioxane (MSQ; SiO:CH$_3$), a-SiOC (SiOC:H), or the like. The low-k organic polymer may be, e.g., polyallylether resins, cyclic fluoro resins, siloxane copolymers, fluorinated polyallylether resins, polypentafluorostylene, polytetrafluoro styrene resins, fluorinated polyimide resins, polynaphthalene fluride, polycide resins, or the like. Furthermore, the lower insulating layer 110 may include at least two insulating layers, which are vertically stacked, e.g., along the third direction D3, and a barrier layer between adjacent insulating layers. The barrier layer may be formed of or include at least one of insulating materials, e.g., SiN, SiON, SiC, SiCN, SiOCH, SiOC, SiOF, or the like.

Internal interconnection structure 121a and 122a may be formed in the lower insulating layer 110 on the chip region 10. The internal interconnection structure 121a and 122a may be electrically connected to the semiconductor integrated circuit 101. The internal interconnection structure 121a and 122a may include metal lines 121a and metal vias 122a, which are provided to penetrate the lower insulating layer 110 and to connect the metal lines 121a at different levels to each other. The metal lines 121a and the metal vias 122a may include a first metal material, e.g., W, aluminum (Al), Ti, Ta, cobalt (Co) and copper (Cu). As an example, the metal lines 121a and the metal vias 122a may be formed of copper (Cu). The metal lines 121a and the metal vias 122a may include a metal nitride layer (e.g., TiN, WN, TaN, or TaSiN) serving as a barrier metal layer.

The chip pad 123a may be provided on an uppermost layer in the lower insulating layer 110 and may be electrically connected to the semiconductor integrated circuit 101 through the internal interconnection structure 121a and 122a. The chip pad 123a may include data pads for transferring data signals, command/address pads for transferring commands/address signals, power pads applied with a ground or power voltage, pads for testing the semiconductor integrated circuit 101, or the like. The chip pad 123a may be formed of or include a second metal material, which is different from the first metal material, e.g., W, Al, Ti, Ta, Co, and Cu. As an example, the chip pad 123a may be formed of or include aluminum (Al). The chip pad 123a may include a metal nitride layer (e.g., TiN, WN, TaN, or TaSiN) serving as a barrier metal layer.

A dam structure 120 may be formed on the edge region 23 of the semiconductor substrate 100. The dam structure 120 may be formed to enclose each of the chip regions 10, when viewed in a plan view, e.g., may surround each chip region 10 along the first and second directions D1 and D2. The dam structure 120 may have a ring shape or a closed loop shape, when viewed in a plan view. The dam structure 120 may be formed when the internal interconnection structure 121a and 122a is formed on the chip region 10 and may include metal vias penetrating the lower insulating layer 110 and metal lines on the metal vias.

In some embodiments, the process monitoring structures 40 may be formed on a portion of the scribe line region 20, as shown in FIGS. 2 and 6. The process monitoring structures 40 may include process monitoring patterns provided in the lower insulating layer 110 on the edge region 23. As an example, the process monitoring patterns may be formed when the chip pads 123a are formed and may be located at substantially the same level as the chip pads 123a, e.g., a distance along the third direction D3 from the substrate 100. As another example, the process monitoring patterns may be formed when the internal interconnection structure 121a and 122a is formed on the chip region 10.

An upper insulating layer 130 may be formed on the uppermost layer in the lower insulating layer 110 to cover the chip pad 123a and the dam structure 120. In some embodiments, the upper insulating layer 130 may be formed of or include an insulating material whose material strength is higher than the lower insulating layer 110. The upper insulating layer 130 may include an insulating material whose dielectric constant is higher than the lower insulating layer 110. For example, the upper insulating layer 130 may be formed of or include at least one of a silicon oxide layer, a silicon nitride layer, a silicon oxynitride layer, or the like. In certain embodiments, the upper insulating layer 130 may be formed of or include at least one of, e.g., silicon nitride (SiN), silicon oxynitride (SiON), SiCN, high density plasma (HDP) oxide, tetraethylorthosilicate (TEOS), plasma-enhanced TEOS (PE-TEOS), O3-TEOS, undoped silicate glass (USG), phosphosilicate glass (PSG), borosilicate glass (BSG), borophosphosilicate glass (BPSG), fluoride silicate glass (FSG), spin-on-glass (SOG) materials, tonen silazane (TOSZ), any combination thereof, or the like.

In some embodiments, the upper insulating layer 130 may include a plurality of insulating layers. As an example, the upper insulating layer 130 may include a first upper insulating layer 131, a second upper insulating layer 133, and a third upper insulating layer 135, which are sequentially stacked along the third direction D3 on the lower insulating layer 110. Here, the second upper insulating layer 133 may be formed of an insulating material having an etch selectivity with respect to the first and third upper insulating layers 131 and 135, and may be thinner than the first and third upper insulating layers 131 and 135 along the third direction D3. The first and third upper insulating layers 131 and 135 may be formed of different insulating materials. The third upper insulating layer 135 may be thicker than the first upper insulating layer 131 along the third direction D3. As an example, the first upper insulating layer 131 may be a HDP oxide layer, the second upper insulating layer 133 may be a silicon nitride layer, and the third upper insulating layer 135 may be a TEOS layer.

Figure 5B:
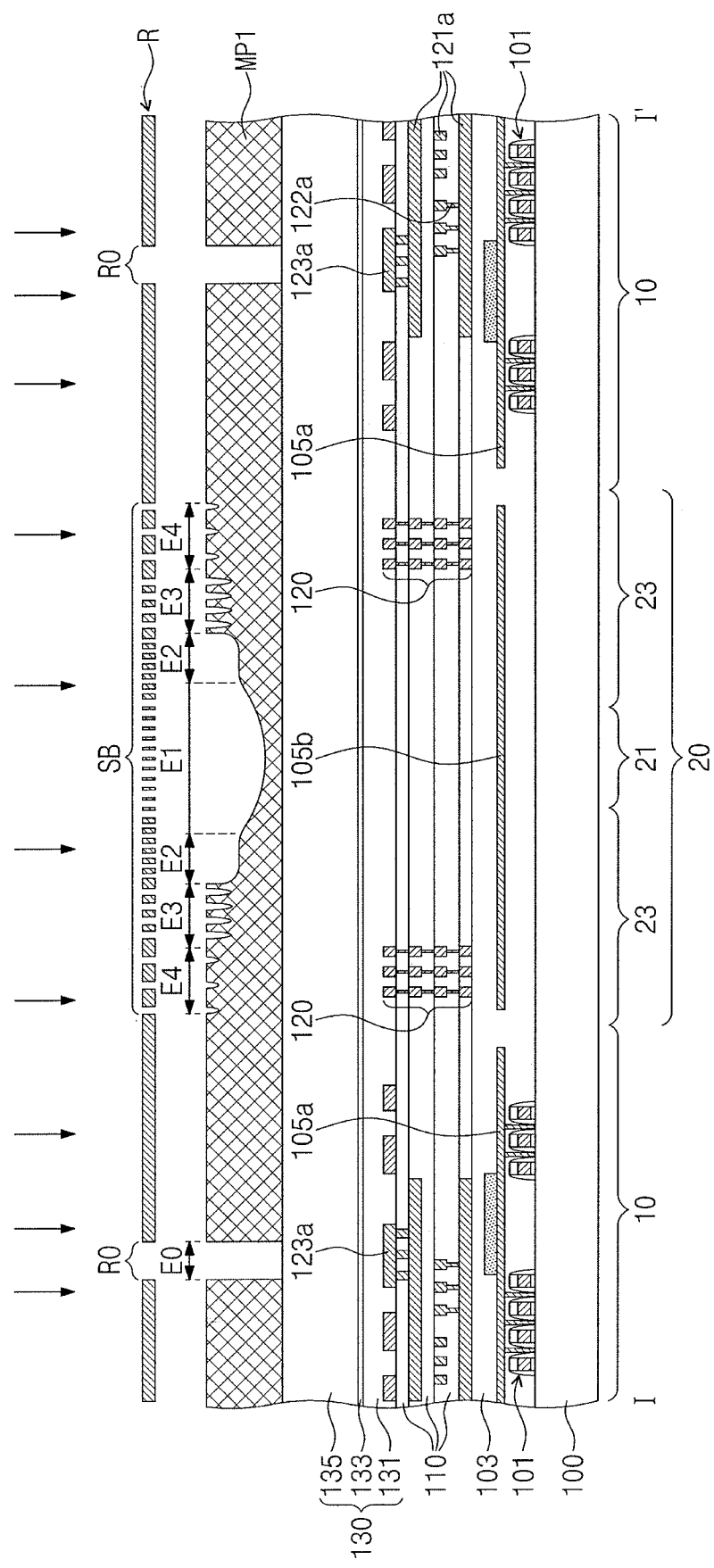

Referring to FIGS. 2 and 5B, a first mask pattern MP1 may be formed on the upper insulating layer 130. In some embodiments, the first mask pattern MP1 may have openings corresponding to the chip pads 123a and a recess portion corresponding to the scribe line region 20. The formation of the first mask pattern MP1 may include coating a photoresist layer on the upper insulating layer 130, performing an exposure process using a reticle R with scattering bars SB, and developing the photoresist layer.

The exposure process on the photoresist layer may be performed by irradiating the photoresist layer with an electron beam or light provided through the reticle R. The reticle R for the exposure process may include the scattering bars SB provided in a region corresponding to the scribe line region 20 of the semiconductor substrate 100. The scattering bars SB of the reticle R may be composed of line-and-space patterns, island patterns, combinations thereof, or the like. In some embodiments, at least one of the scattering bars SB of the reticle R may be shaped like a rectangular ring, when viewed in a plan view.

In the exposure process, an energy of light incident on the photoresist layer on the scribe line region 20 through the scattering bars SB of the reticle R may be less than an energy of light incident into the photoresist layer on the chip region 10 through an opening RO of the reticle R. A density of the scattering bars SB may be higher in a portion of the reticle R corresponding to the cutting region 21 than in another portion corresponding to the edge regions 23. Thus, the energy of light incident into the photoresist layer may be greater on the cutting region 21 than on the edge region 23.

In more detail, the first mask pattern MP1 may include a chip exposure region E0, a first exposure region E1, a second exposure region E2, a third exposure region E3, and a fourth exposure region E4. Here, the first exposure region E1 may be exposed by an electron beam or light whose energy or intensity is lower than that for the chip exposure region E0, the second exposure region E2 may be exposed by an electron beam or light whose energy or intensity is lower than that for the first exposure region E1, the third exposure region E3 may be exposed by an electron beam or light whose energy or intensity is lower than that for the second exposure region E2, and the fourth exposure region E4 may be exposed by an electron beam or light whose energy or intensity is lower than that for the third exposure region E3.

The first mask pattern MP1 may have a thickness along the third direction D3 that decreases in a direction from the edge region 23 toward a center of the cutting region 21, e.g., along the horizontal direction, e.g., the first or second directions D1 or D2. A thickness of the first exposure region E1 of the first mask pattern MP1 may be about 25%-40% of a thickness of a non-exposure region. The first mask pattern MP1 may have a stepwise portion between each pair of the first to fourth exposure regions E1, E2, E3, and E4. Furthermore, the density of the scattering bars SB in the first exposure region E1 may vary in a continuous manner. Thus, the first exposure region E1 of the first mask pattern MP1 may have a rounded surface. Since the density of the scattering bars SB decreases in a direction toward the chip region 10 along the horizontal direction, e.g., the first or second directions D1 or D2, recess regions may be formed in top surfaces of the third and fourth exposure regions E3 and E4 of the first mask pattern MP1.

Figure 5C:
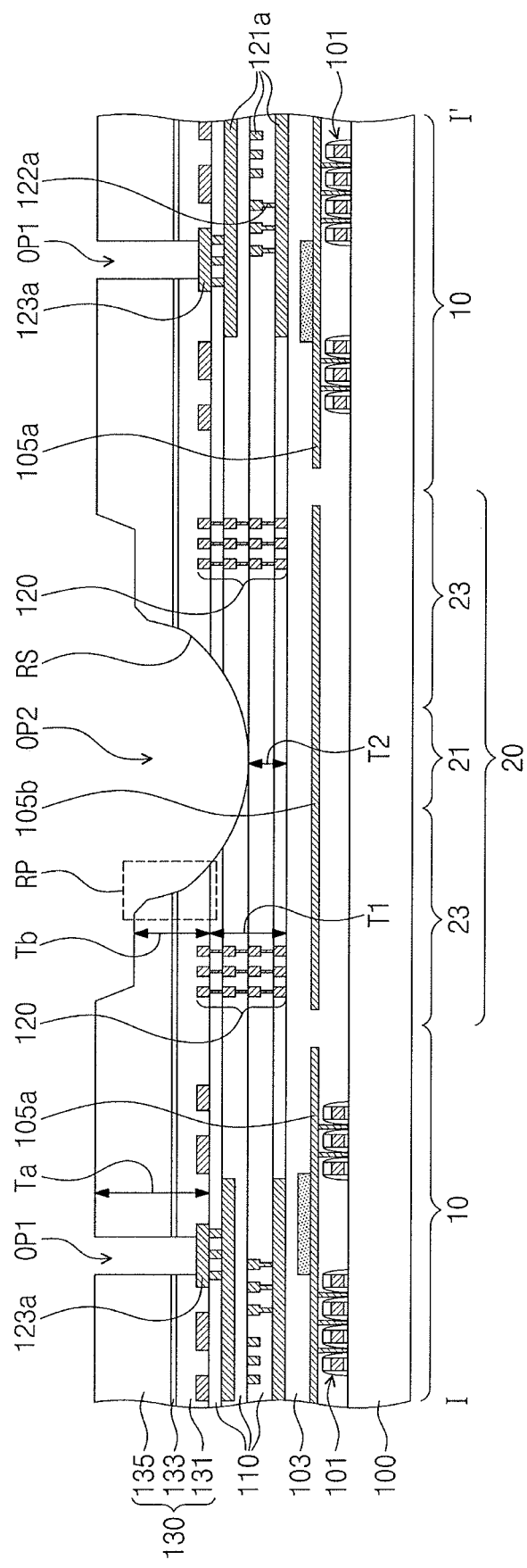

Referring to FIGS. 2 and 5C, first openings OP1 may be formed in the upper insulating layer 130 on the chip regions 10, and a second opening OP2 may be formed in the upper insulating layer 130 on the scribe line region 20. The first openings OP1 may expose the chip pads 123a, respectively, and the second opening OP2 may be expose a portion of the lower insulating layer 110.

The first and second openings OP1 and OP2 may be formed by anisotropically etching the upper insulating layer 130 using the first mask pattern MP1 as an etch mask. The first mask pattern MP1 may be removed after the formation of the first and second openings OP1 and OP2.

The first openings OP1 on the chip regions 10 may be formed to have substantially the same size and a uniform distance. Each of the first openings OP1 may have a rectangular, square, circular, or polygonal shape. The second opening OP2 may have a linear shape extending in the first or second direction D1 or D2.

Since the etching process is performed through the recess portion of the first mask pattern MP1 (e.g., see FIG. 5B), the lower and upper insulating layers 110 and 130 may be partially removed to form the second opening OP2 on the scribe line region 20. On the scribe line region 20, the lower and upper insulating layers 110 and 130 may have a thickness decreasing in a direction from the edge region 23 toward the cutting region 21. At least a portion of the second opening OP2 may have a rounded inner surface RS.

A thickness of the upper insulating layer 130 along the third direction D3 exposed to the second opening OP2 may decrease in a direction away from the chip region 10, e.g., along the horizontal direction, e.g., the first or second directions D1 or D2. Similarly, a thickness of the lower insulating layer 110 along the third direction D3 exposed to the second opening OP2 may also decrease in the direction away from the chip region 10, e.g., along the horizontal direction, e.g., the first or second directions D1 or D2.

On the scribe line region 20, the lower insulating layer 110 may include a first portion having a first lower thickness T1 and a second portion having a second lower thickness T2 smaller than the first lower thickness T1 along the third direction D3. Here, the first lower thickness T1 of the first portion may be substantially equal to a thickness of the lower insulating layer 110 on the chip region 10. In addition, the second portion may be exposed by the second opening OP2 of the upper insulating layer 130.

In more detail, as shown in FIG. 5J, the upper insulating layer 130 may include a first portion 130_1 on the chip region 10, a second portion 130_2 that extends from the first portion along the edge region 23, and a third portion RP spaced apart from the first portion and extends from the second portion, i.e., the second portion 130_2 is between the first portion 130_1 and the third portion RP along the horizontal direction, e.g., the first or second directions D1 or D2. Here, the first portion 130_1 may have a substantially uniform thickness (hereinafter, a first thickness Ta), the second portion 130_2 may have a second thickness Tb that is smaller than the first thickness Ta, and the third portion RP may have a thickness that is smaller than the second thickness Tb and decreases in a direction away from the second portion 130_2 towards a center of the scribe line 20, i.e., the cutting region 21. In other words, the third portion RP may have the rounded inner surface RS. The upper insulating layer 130 may have a mirror image structure along the third direction D3 for an adjacent chip region 10.

As an example, the second portion 130_2 of the upper insulating layer 130 may be provided on the dam structure 120. The upper insulating layer 130 may have a first inclined surface S1 between the first portion 130_1 and the second portion 130_2, and a second inclined surface S2 between the second portion 130_2 and the third portion RP. Here, an inclination angle of the first inclined surface S1 may be different from that of the second inclined surface S2. In other words, the upper insulating layer 130 may have a first stepped structure between the first portion 130_1 and the second portion 130_2, and a second stepped structure between the second portion 130_2 and the third portion RP.

In addition, as shown in FIG. 6, the upper insulating layer 130 may further include a fourth portion, which is located on the scribe line region 20 and has substantially the same thickness as the first thickness Ta. Here, the fourth portion may be provided to cover the process monitoring structure 40.

The second opening OP2 formed in the upper insulating layer 130 may be spaced apart from the process monitoring structure 40 and a side surface of the second opening OP2 adjacent to the process monitoring structure 40 may also have a rounded shape, as shown in FIG. 6.

Figure 5D:
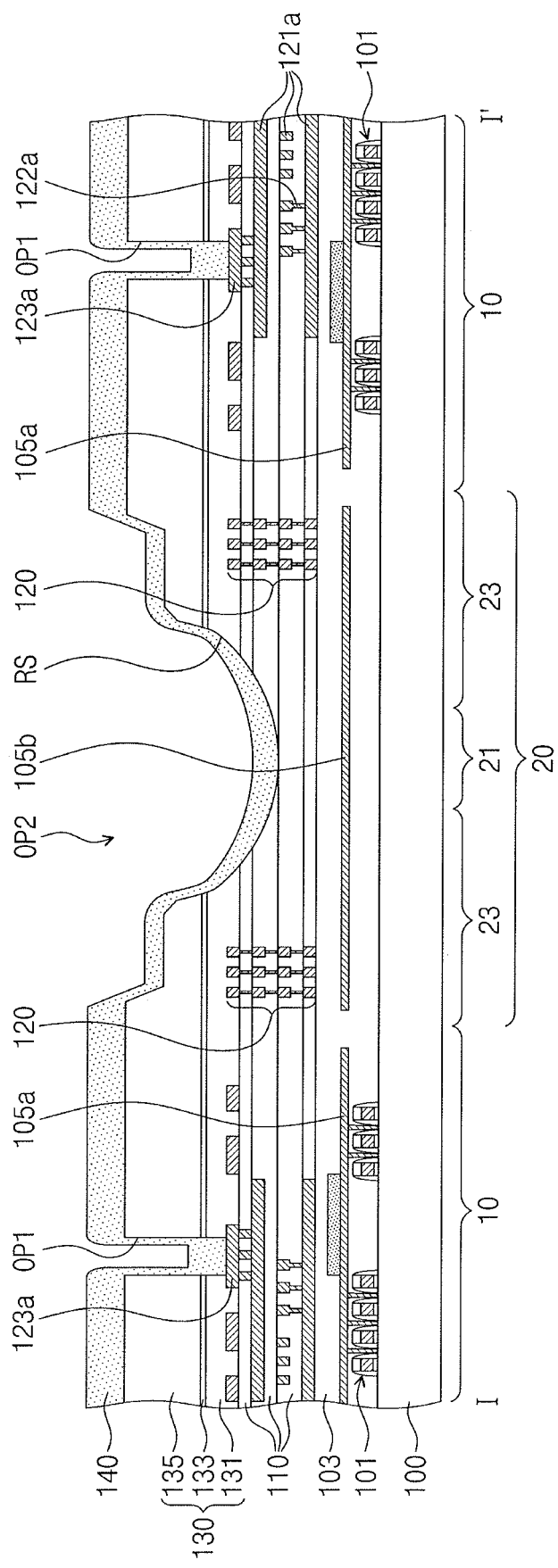

Referring to FIGS. 2 and 5D, a re-distribution layer 140 may be formed on the upper insulating layer 130 with the first and second openings OP1 and OP2. The re-distribution layer 140 may be formed to partially fill the first and second openings OP1 and OP2, and may include a portion in the first opening OP1 to be in contact with the chip pad 123a.

The re-distribution layer 140 may be formed by forming a metal seed layer to conformally cover the upper insulating layer 130 with the first and second openings OP1 and OP2 and forming a metal layer on the metal seed layer. The metal seed layer and the metal layer may be formed by a film deposition method, such as an electroplating method, an electro-less plating method, and a sputtering method. The re-distribution layer 140 may be formed of at least one of Cu, Al, nickel (Ni), silver (Ag), gold (Au), platinum (Pt), tin (Sn), lead (Pb), Ti, chrome (Cr), palladium (Pd), indium (In), zinc (Zn), carbon (C), any alloy thereof, or the like. As an example, the re-distribution layer 140 may be formed of or include aluminum (Al).

Figure 5E:
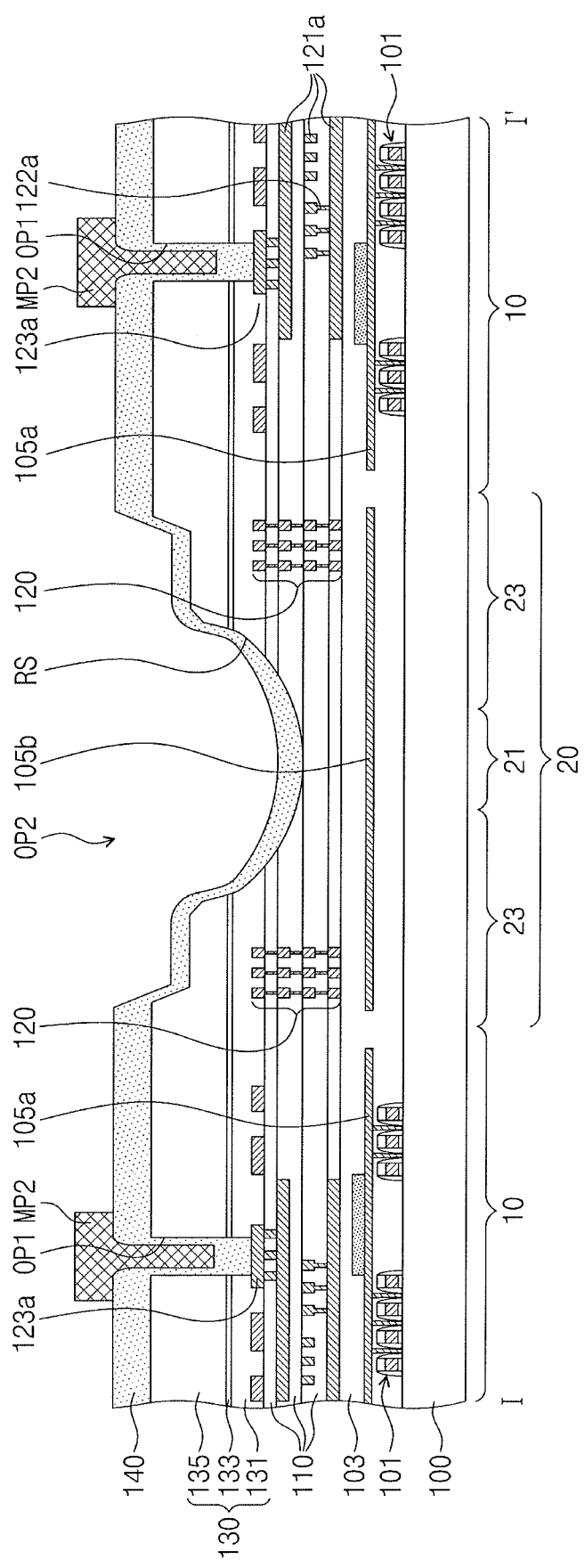

Referring to FIGS. 2 and 5E, after formation of the re-distribution layer 140, a second mask pattern MP2 may be formed on the re-distribution layer 140. The second mask pattern MP2 may be locally formed on the chip region 10, in particular, on the chip pad 123a. The second mask pattern MP2 may expose the re-distribution layer 140 on the scribe line region 20.

Figure 5F:
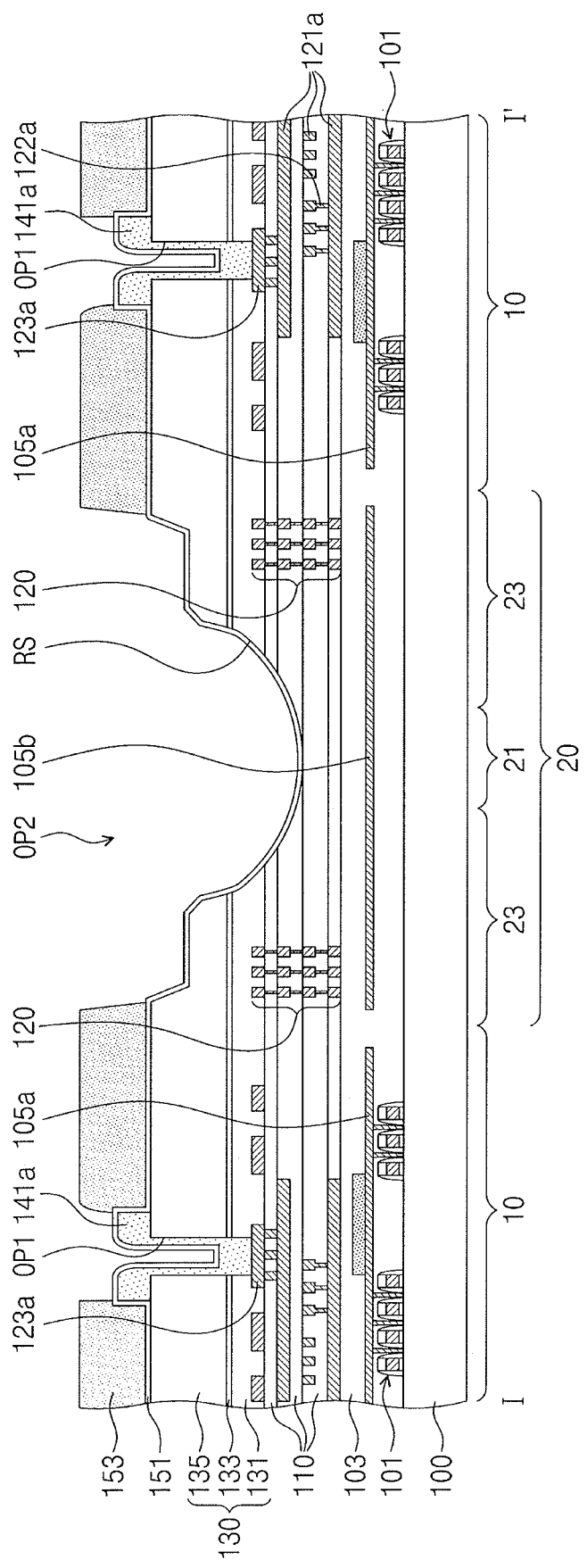

Thereafter, the re-distribution layer 140 may be etched using the second mask pattern MP2 as an etch mask. Accordingly, the redistribution chip pad 141a may be formed in the first opening OP1 on the chip region 10, as shown in FIGS. 2 and 5F. During the formation of the redistribution chip pad 141a, the re-distribution layer 140 may be removed from the scribe line region 20. Thus, an inner surface of the second opening OP2 may be exposed. Since the second opening OP2 has the rounded inner surface RS, etching the re-distribution layer 140 may be performed to completely remove the re-distribution layer 140 from the scribe line region 20.

Next, as shown in FIG. 5F, a passivation layer 153 may be formed on the upper insulating layer 130 to expose a portion of the redistribution chip pad 141a and the scribe line region 20, after the formation of the redistribution chip pad 141a. In certain embodiments, a protection layer 151 may be formed on the semiconductor substrate 100 to conformally cover the structure with the redistribution chip pad 141a, before the formation of the passivation layer 153.

The protection layer 151 may be, e.g., a silicon nitride layer, a silicon oxynitride layer, or the like. The passivation layer 153 may be formed of or include at least one of polyimide materials (e.g., photo sensitive polyimide (PSPI)). The passivation layer 153 may be formed on the protection layer 151 using a spin coating process and may be patterned by an exposure process, without using an additional photoresist layer, to expose a portion of the protection layer 151 on the redistribution chip pad 141a and the protection layer 151 on the scribe line region 20.

Figure 5G:
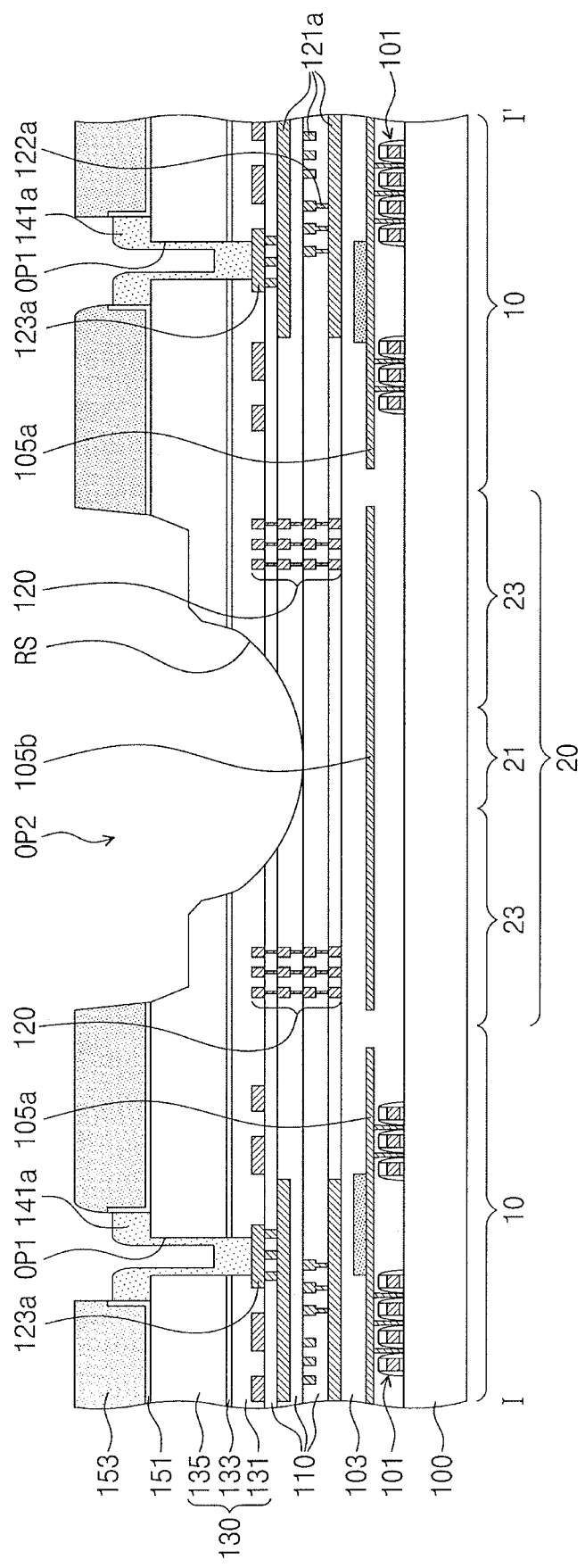

Thereafter, referring to FIGS. 2 and 5G, the protection layer 151 exposed by the passivation layer 153 may be etched to expose the redistribution chip pad 141a. The etching process may be performed to remove the protection layer 151 on the inner surface of the second opening OP2 and on the scribe line region 20. Thus, a portion of the lower insulating layer 110 on the scribe line region 20 may be exposed.

If the redistribution chip pad 141a is exposed, the test process described with reference to FIG. 4 may be performed. A separation process may be performed to separate the semiconductor substrate 100 along the scribe line region 20, after the test process.

Figure 5H:
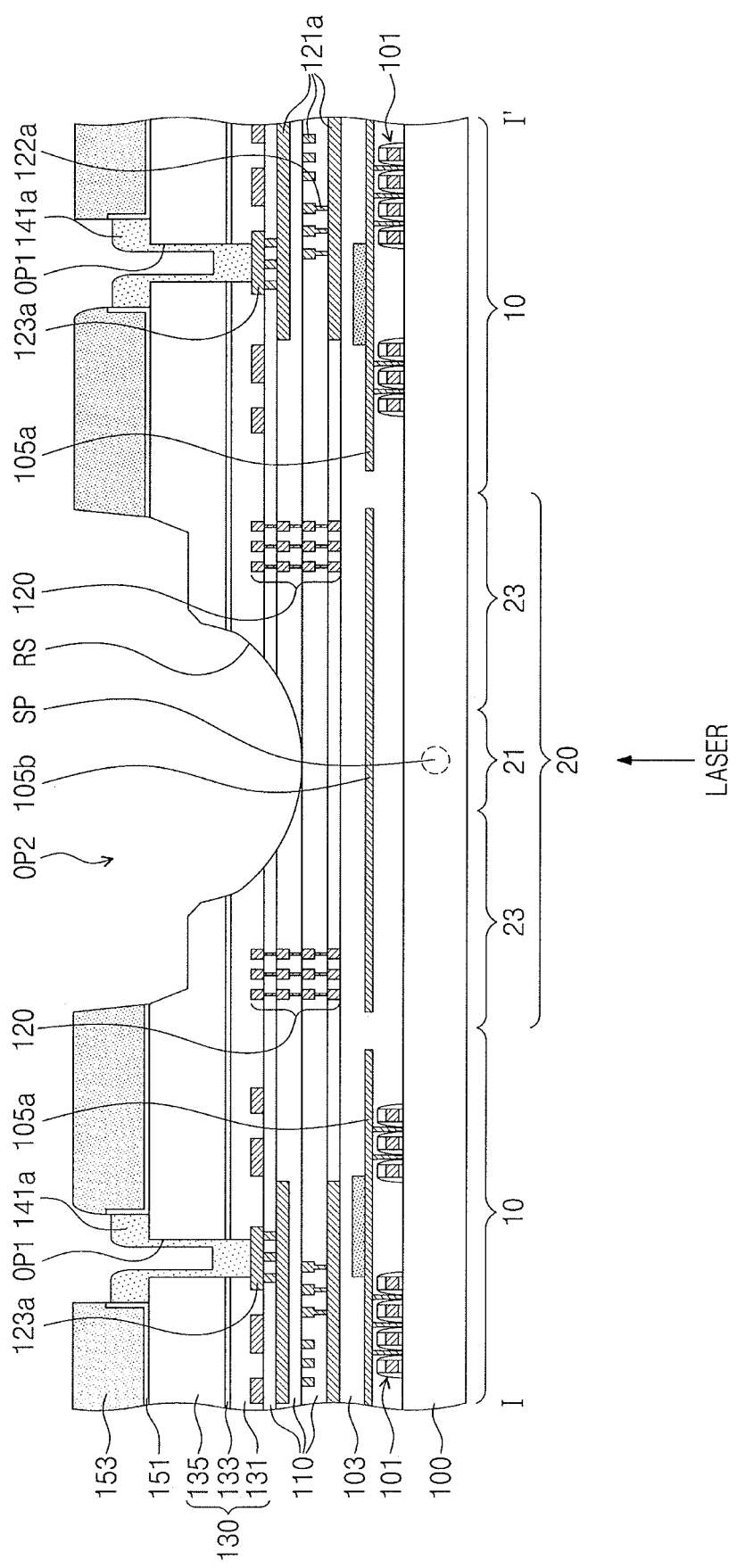

In detail, referring to FIGS. 2 and 5H, a laser beam may be irradiated on the cutting region 21 of the scribe line region 20 through a rear surface of the semiconductor substrate 100. The laser beam may lead to a change in physical property of a laser spot region SP of the semiconductor substrate 100 irradiated with the laser beam. As an example, the laser spot region may have a physical strength lower than other regions of the semiconductor substrate 100.

Figure 5I:
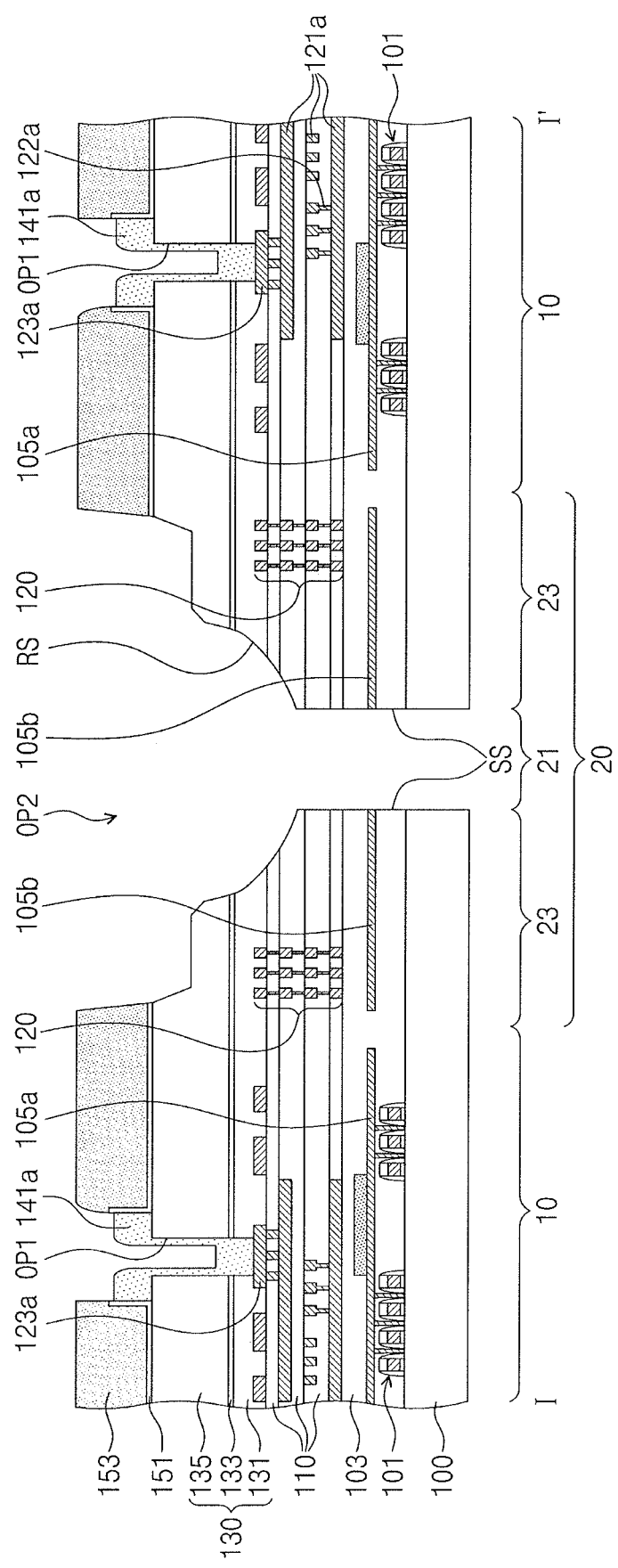
Figure 5J:
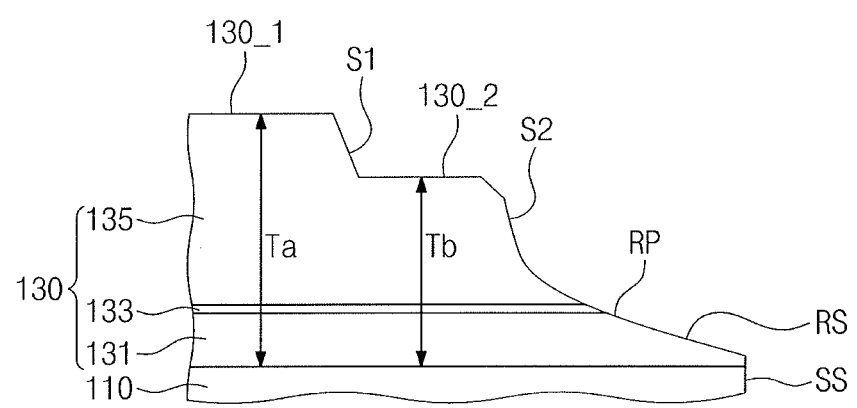
FIG. 5J illustrates an enlarged diagram of a portion of an edge region of the semiconductor device of FIG. 5I.

Thereafter, referring to FIGS. 2 and 5I, the semiconductor substrate 100 may be placed on a thin film tape and, then, the thin film tape may be forcedly elongated in a horizontal direction, thereby separating the semiconductor substrate 100 along the cutting region 21 of the scribe line region 20. In certain embodiments, a sawing process may be performed along the cutting region 21 of the scribe line region 20 to separate the chip regions 10 from each other. Here, a sawing wheel or a laser beam may be used for the sawing process.

As a result of the cutting process, the semiconductor substrate 100 may be divided into semiconductor chips separated from each other. Each of the semiconductor chips may include the chip region 10 and the edge region 23 around the chip region 10. After the cutting process on the semiconductor substrate 100, the upper insulating layer 130 on the edge region 23 may have a stepped structure, which is defined by the first and second portions having different thicknesses (i.e., the first and second thicknesses). In addition, the lower insulating layer 110 on the edge region 23 may include the first portion having the first lower thickness T1 and the second portion with the second lower thickness T2 smaller than the first lower thickness T1. As a result of the cutting process, a separation surface SS defined by the semiconductor substrate 100 and the lower insulating layer 110 may be formed.

In some embodiments, when the semiconductor substrate 100 is divided into the chip regions 10, the upper insulating layer 130, which has a material strength greater than the lower insulating layer 110, may not be on the cutting region 21, except for the region provided with the process monitoring structures 40. Thus, incomplete separation of the semiconductor substrate 100 or a peeling in the thin film tape, which may result from a difference in physical or chemical characteristics between the lower and upper insulating layers 110 and 130, during the separating process may be prevented. In other words, horizontal cracking along an interface between the lower and upper insulating layers 110 and 130 may be prevented. In addition, since the lower insulating layer 110 is thinner on the cutting region 21 than on the edge regions 23, the separating process on the semiconductor substrate 100 may be easily performed.

In some embodiments, since, after the separating process, a metallic material in the re-distribution layer does not remain on the edge region 23, a process failure in a subsequent packaging process on the semiconductor chip may be reduced.

Hereinafter, semiconductor devices according to various embodiments will be described. For concise description, an element previously described with reference to FIG. 4 and FIGS. 5A to 5J may be identified by a similar or identical reference number without repeating an overlapping description thereof.

Figure 7:
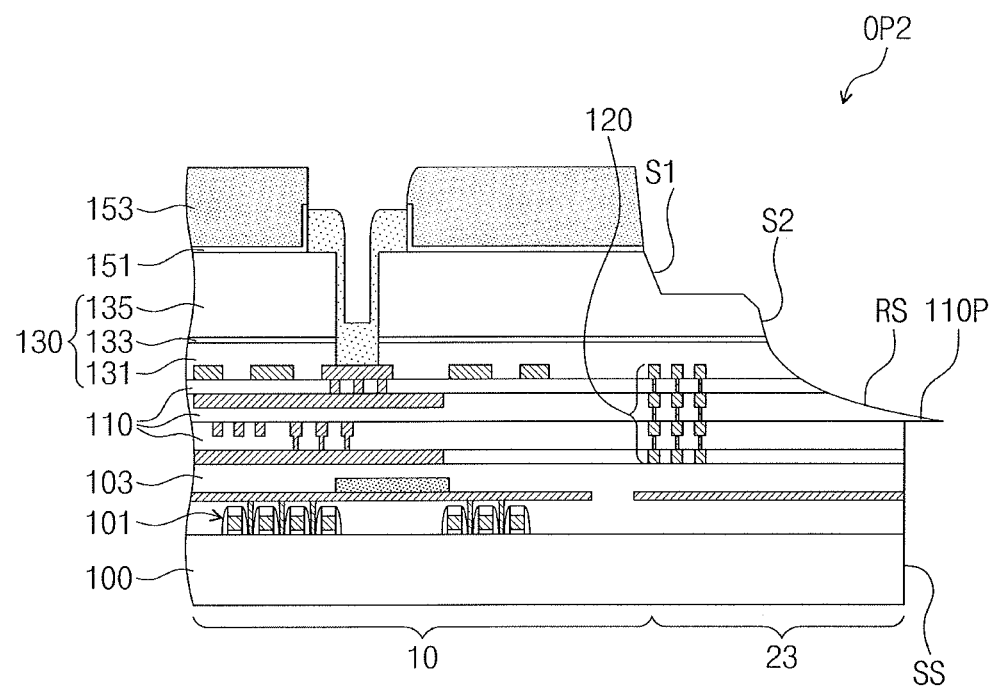
FIGS. 7, 8, and 9 illustrate sectional views of a portion of a semiconductor device according to an embodiment.
Figure 8:
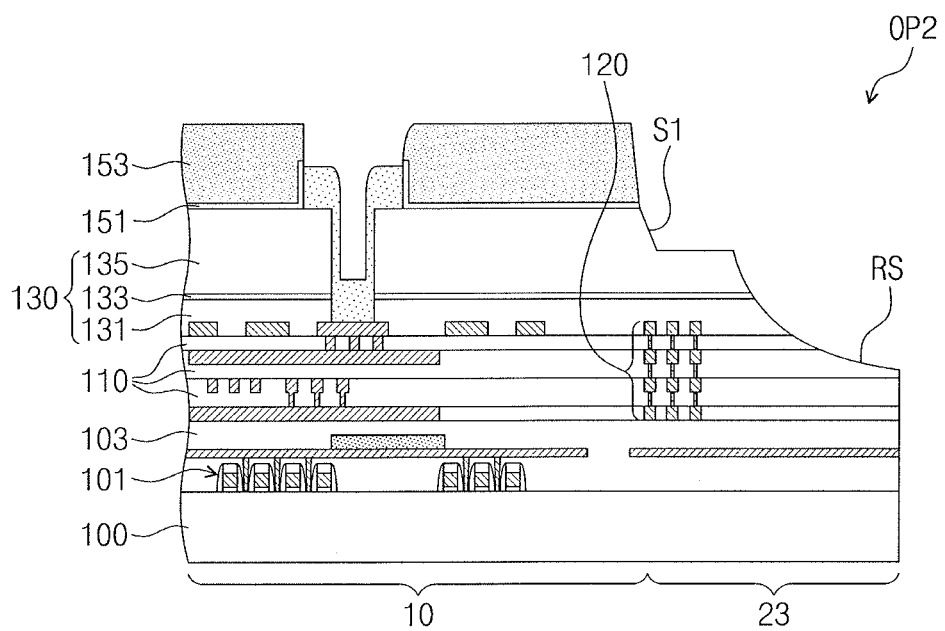
Figure 9:
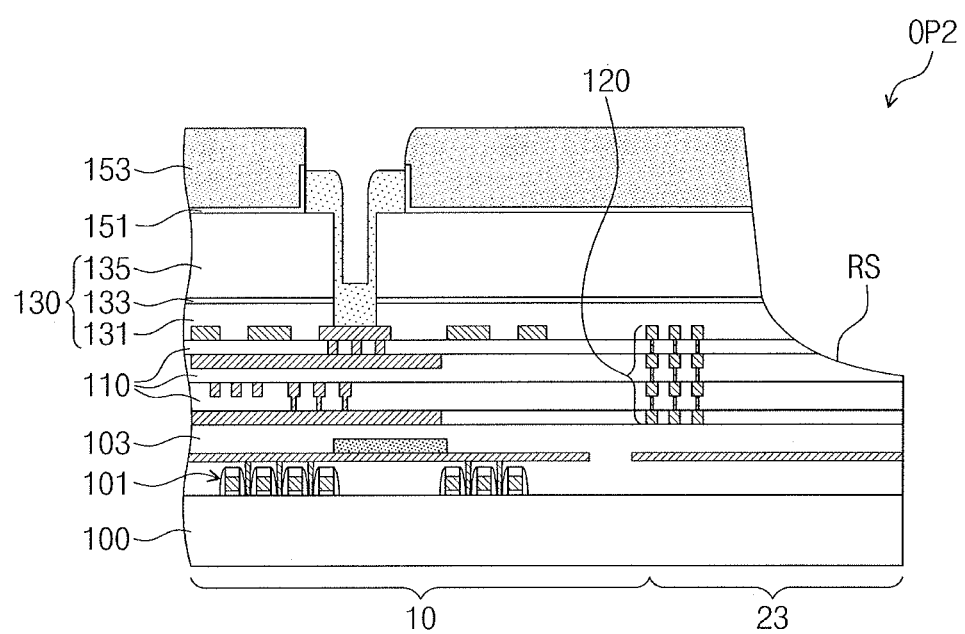

FIGS. 7, 8, and 9 are sectional views illustrating a portion of a semiconductor device according to an embodiment.

Referring to FIG. 7, the semiconductor substrate 100 may be separated along the scribe line region 20, after the irradiation of the laser beam through the rear surface of the semiconductor substrate 100, as described with reference to FIGS. 5H and 5J. At this time, the lower insulating layers 110 may be torn. Thus, the lower insulating layers 110 may have a protruding portion 110P laterally protruding from a separation surface SS of the semiconductor device. The protruding portion 110P of the lower insulating layer 110 may have an irregular or non-uniform shape.

Referring to FIG. 8, the upper insulating layer 130 may include the first portion 130_1 having the first thickness Ta, the second portion 130_2 having the second thickness Tb, and the third portion RP having a decreasing thickness in a direction away from the second portion towards the center, as previously described with reference to FIG. 5J. The second thickness Tb of the second portion 130_2 may be uniform and the upper insulating layer 130 may have the first inclined surface S1 between the first and second portions. The thickness of the third portion RP may be continuously reduced from the second thickness Tb, and the upper insulating layer 130 may have the rounded inner surface RS between the second and third portions, e.g. the second inclined surface S2 is continuous with the rounded inner surface RS, unlike FIG. 5J.

Referring to FIG. 9, the upper insulating layer 130 may have a continuously decreasing thickness (i.e., without a stepped structure), on the edge region 23. The rounded inner surface RS may be continuously formed from a top surface of the upper insulating layer 130 to a top surface of the lower insulating layer 110, e.g., starting in edge regions 23 that do not overlap the process monitoring structures 40 and the dam structures 120 along the third direction D3.

Figure 10A:
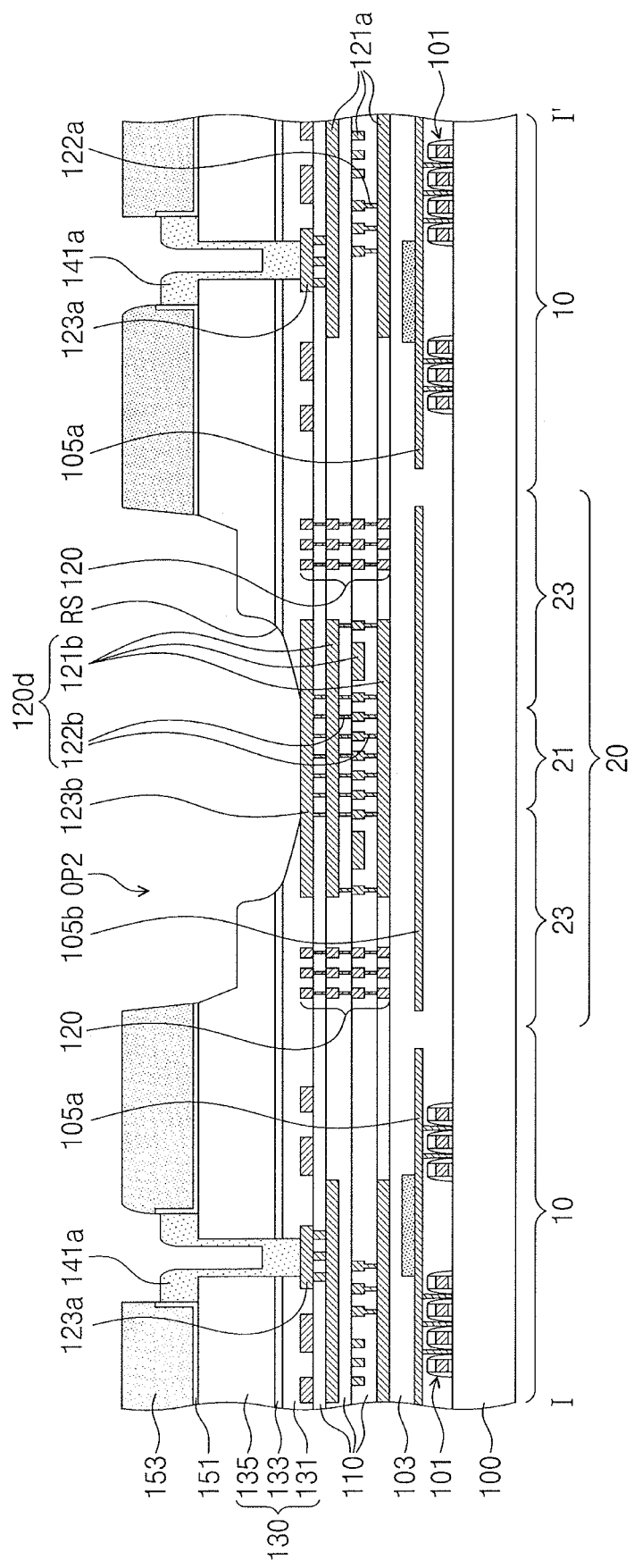
FIGS. 10A and 10B illustrate sectional views of vertical sections of a semiconductor device according to an embodiment, before and after a process of dividing semiconductor chips.
Figure 10B:
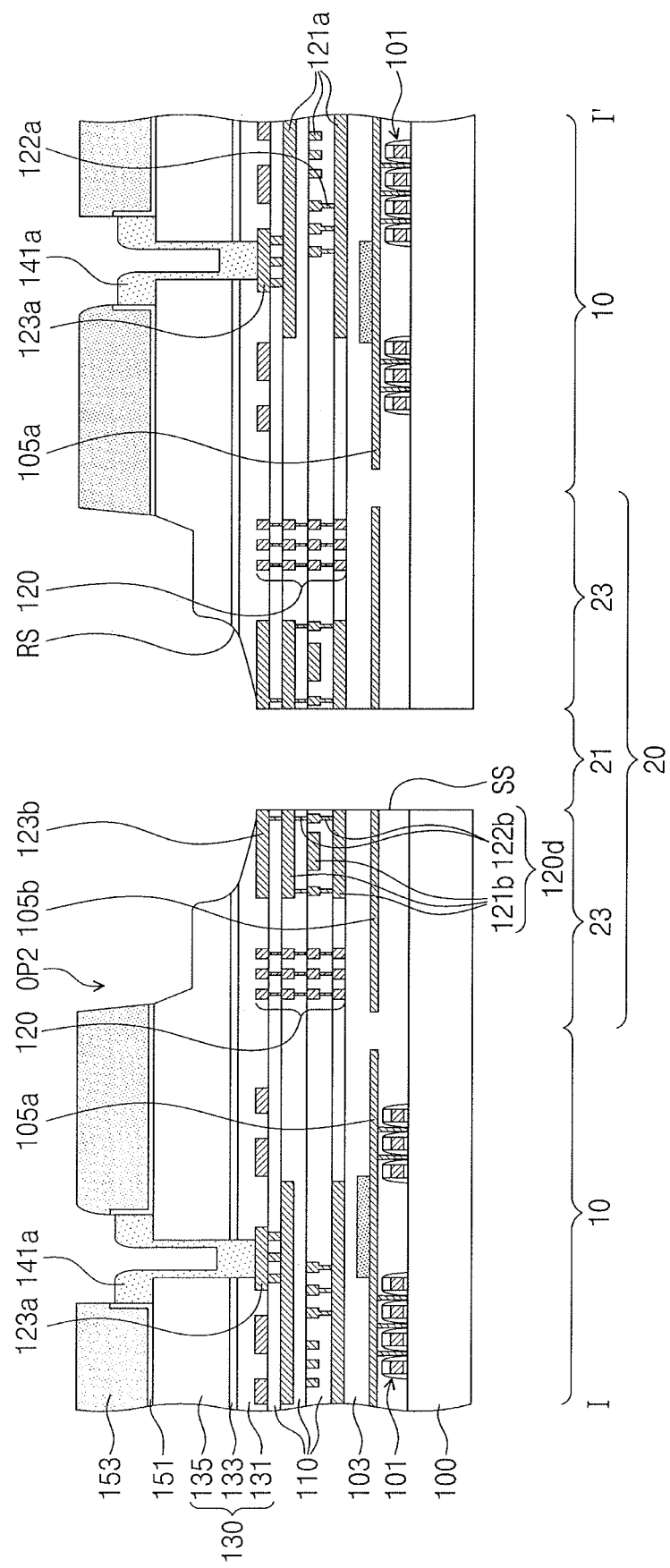
Figure 11:
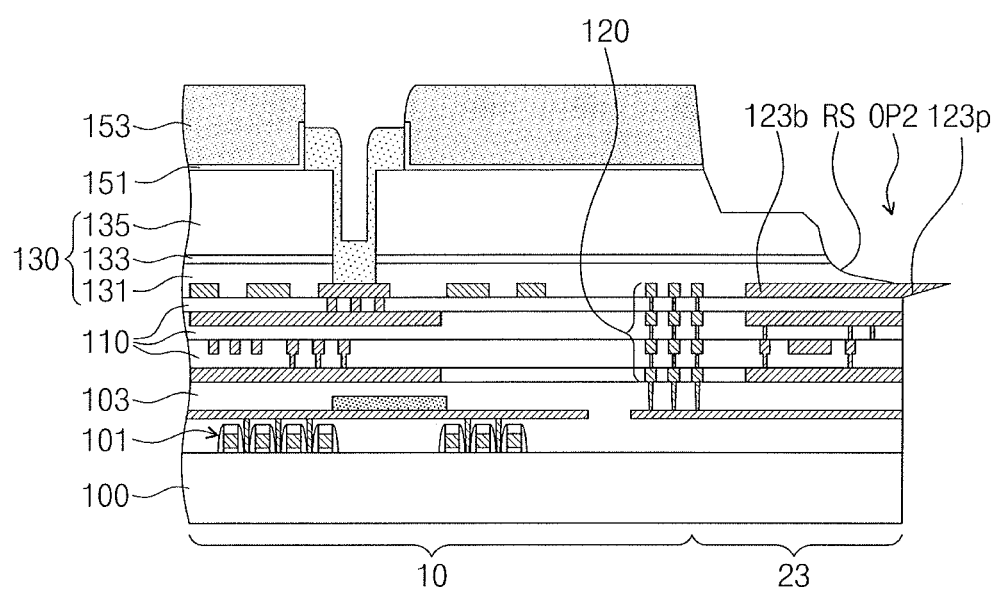
FIG. 11 illustrates a sectional view of a portion of a semiconductor device according to an embodiment.

FIGS. 10A and 10B are sectional views illustrating vertical sections of a semiconductor device according to an embodiment before and after a process of dividing semiconductor chips. FIG. 11 is a sectional view illustrating a portion of a semiconductor device according to an embodiment.

Referring to FIG. 10A, a dummy metal pattern 123b may be provided on the lower insulating layer 110 on the scribe line region 20. The dummy metal pattern 123b may be formed when the chip pad 123a is formed on the chip region 10 and may be formed of or include, for example, aluminum (Al). The upper insulating layer 130 may have the second opening OP2 in the scribe line region 20 that exposes a portion of the dummy metal pattern 123b.

A dummy metal structure 120d may be provided in the lower insulating layer 110 on the scribe line region 20. The dummy metal structure 120d may overlap the dummy metal pattern 123b, when viewed in a plan view, e.g., along the third direction D3.

The dummy metal structures 120d may include dummy metal lines 121b and dummy metal vias 122b, which are alternately stacked along the third direction D3. The dummy metal vias 122b may connect the dummy metal lines 121b, which are provided at different levels along the third direction D3, to each other. The dummy metal structures 120d may be formed when the internal interconnection structure 121a and 122a is formed on the chip region 10 and may be formed of or include, for example, copper (Cu).

Referring to FIG. 10B, the semiconductor substrate 100 may be cut along the scribe line region 20 to divide the semiconductor substrate 100 into a plurality of semiconductor chips, after the irradiation of the laser beam through the rear surface of the semiconductor substrate 100, as described with reference to FIGS. 5H and 5I In this case, a portion of the dummy metal structures 120d and a portion of the dummy metal pattern 123b may remain on the edge region 23. After the cutting process on the semiconductor substrate 100, the upper insulating layer 130 on the edge region 23 may have a stepped structure defined by the first and second portions 130_1 and 130_2.

Furthermore, when the second opening OP2 of the upper insulating layer 130 exposes a portion of the dummy metal pattern 123b, the dummy metal pattern 123b may be irregularly servered by the separating process on the semiconductor substrate 100, as shown in FIG. 11. Accordingly, the dummy metal pattern 123b remaining on the edge region 23 may have a protruding portion 123p laterally protruding from the separation SS of the semiconductor device.

Figure 12:
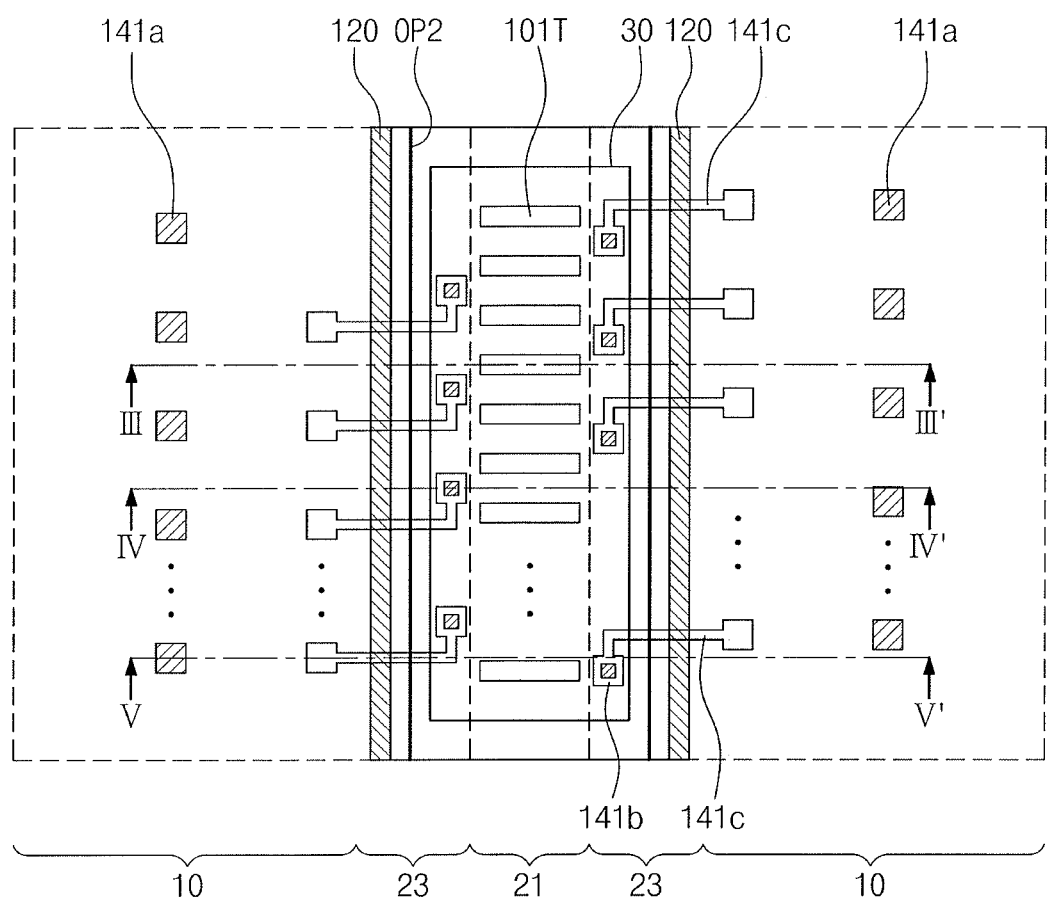
FIG. 12 illustrates an enlarged plan view of a portion of a semiconductor device according to an embodiment.
Figure 13A:
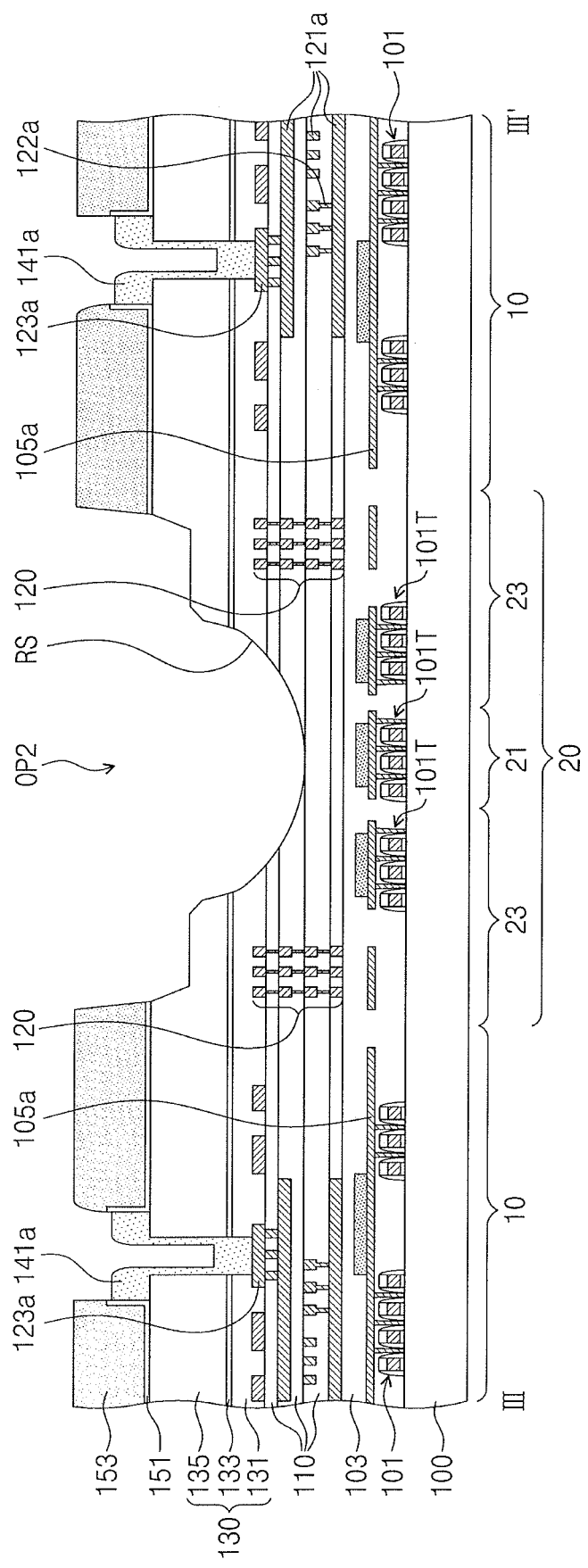
FIGS. 13A and 13B illustrate sectional views, which are taken along a line III-III' of FIG. 12 and illustrate vertical sections of a semiconductor device according to an embodiment, before and after a process of dividing semiconductor chips.
Figure 13B:
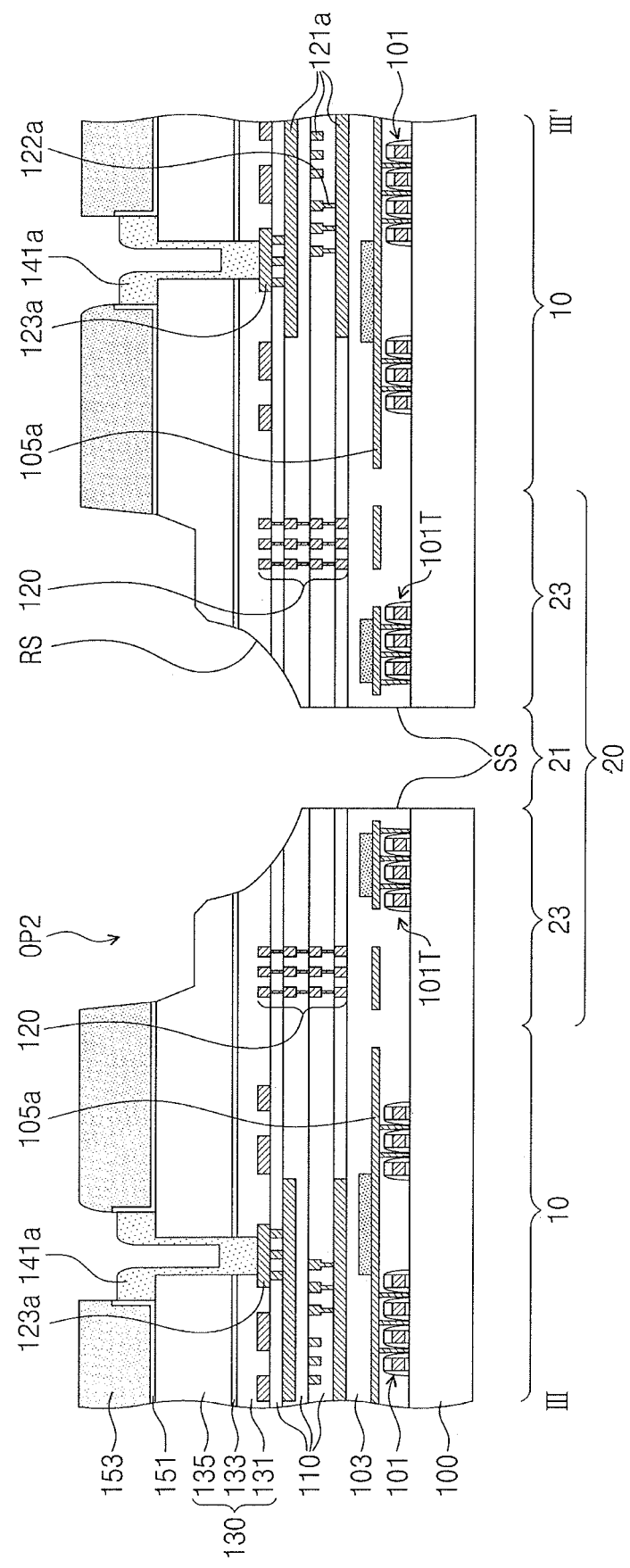
Figure 14:
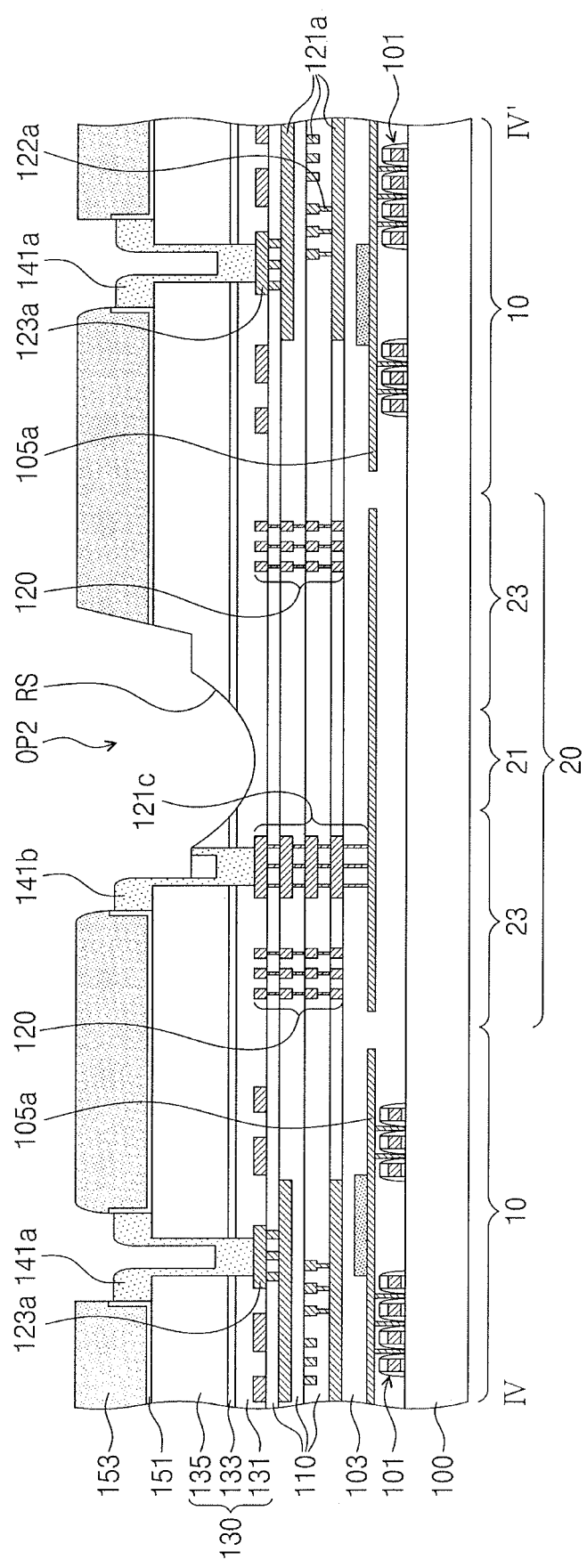
FIGS. 14 and 15 illustrate sectional views, which are respectively taken along lines IV-IV' and V-V of FIG. 12, of a portion of a semiconductor device according to an embodiment.
Figure 15:
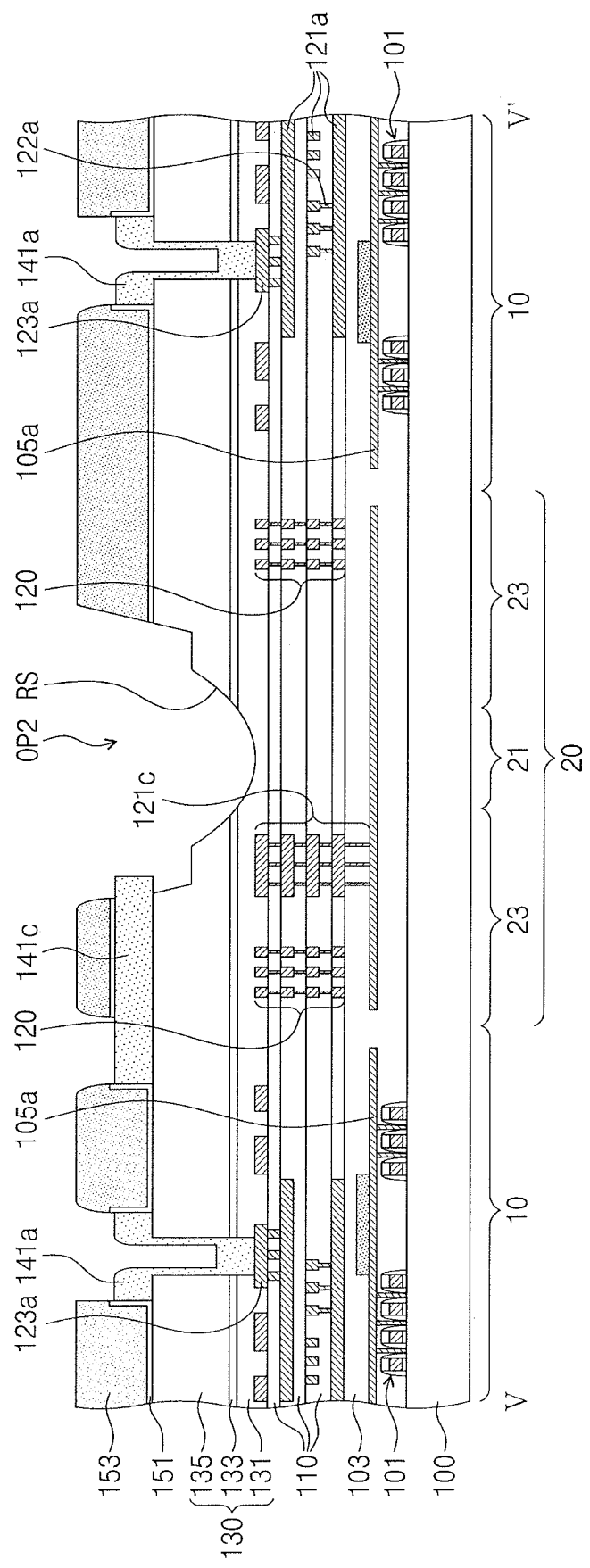

FIG. 12 is an enlarged plan view illustrating a portion of a semiconductor device according to an embodiment. FIGS. 13A and 13B are sectional views, which are taken along a line of FIG. 12 and illustrate vertical sections of a semiconductor device according to an embodiment, before and after a process of dividing semiconductor chips. FIGS. 14 and 15 are sectional views, which are respectively taken along lines IV-IV' and V-V' of FIG. 12 and illustrate a portion of a semiconductor device according to an embodiment.

Referring to FIGS. 12 and 13A, the semiconductor substrate 100 may include the chip regions 10 and the scribe line region 20 between the chip regions 10. The scribe line region 20 may include the cutting region 21 and the edge regions 23, as described above.

When the semiconductor integrated circuits 101 are formed on the chip region 10, a plurality of test element groups 30 (e.g., see FIG. 2) may be formed on a portion of the scribe line region 20. The test element groups 30 may include various test structures 101T, which are provided to test the semiconductor integrated circuits 101.

In detail, the test structures 101T may be spaced apart from each other in the second direction D2, on the cutting region 21. The test structures 101T may be formed using a process for forming the semiconductor integrated circuits 101 on the chip regions 10. The test structures 101T may include test circuits, each of which has substantially the same structure as a corresponding one of the semiconductor integrated circuits 101. The lower insulating layer 110 may be formed to cover the semiconductor substrate 100 provided with the semiconductor integrated circuits 101 and the test structures 101T.

As described above, the upper insulating layer 130 on the scribe line region 20 may have the second opening OP2 exposing a portion of the lower insulating layer 110. Here, the second opening OP2 may have the rounded inner surface RS and may overlap the test element group 30, when viewed in a plan view, e.g., along the third direction D3. A portion of the lower insulating layer 110 exposed by the second opening OP2 may have a second lower thickness, which is less than a first lower thickness of the lower insulating layer 110 on the chip region 10.

Referring to FIG. 13B, the semiconductor substrate 100 may be cut along the scribe line region 20 to divide the semiconductor substrate 100 into a plurality of semiconductor chips, after the irradiation of the laser beam through the rear surface of the semiconductor substrate 100, as previously described with reference to FIGS. 5H and 5I. In this case, a portion of the test structures 101T may remain on the edge region 23.

Referring to FIGS. 12, 14, and 15, connection structures 120c connected to the test structures 101T may be provided in the lower insulating layer 110 on the scribe line region 20. The connection structures 120c may include metal lines and metal vias including the same metal material as the internal interconnection structures 121a and 122a. The uppermost metal line of the connection structures 120c may be provided as a test pad.

Redistribution test pads 141b, which are coupled to the connection structures 120c through the upper insulating layer 130, may be provided on the edge region 23. The redistribution test pad 141b may include a redistribution line 141c that extends onto a top surface of the upper insulating layer 130 and a pad portion on the chip region 10 that is exposed by the passivation layer 153.

On the scribe line region 20, the upper insulating layer 130 may have the second opening OP2 that exposes a portion of the lower insulating layer 110. In an embodiment, as shown in FIG. 14, portions of the redistribution test pads 141b may be exposed by the second opening OP2. Furthermore, portions of the redistribution test pads 141b may be etched during forming the second opening OP2 in the upper insulating layer 130. In other words, the redistribution test pads 141b may have an asymmetric structure. In an embodiment, as shown in FIG. 15, the redistribution line 141c may be partially exposed by the second opening OP2.

Figure 16:
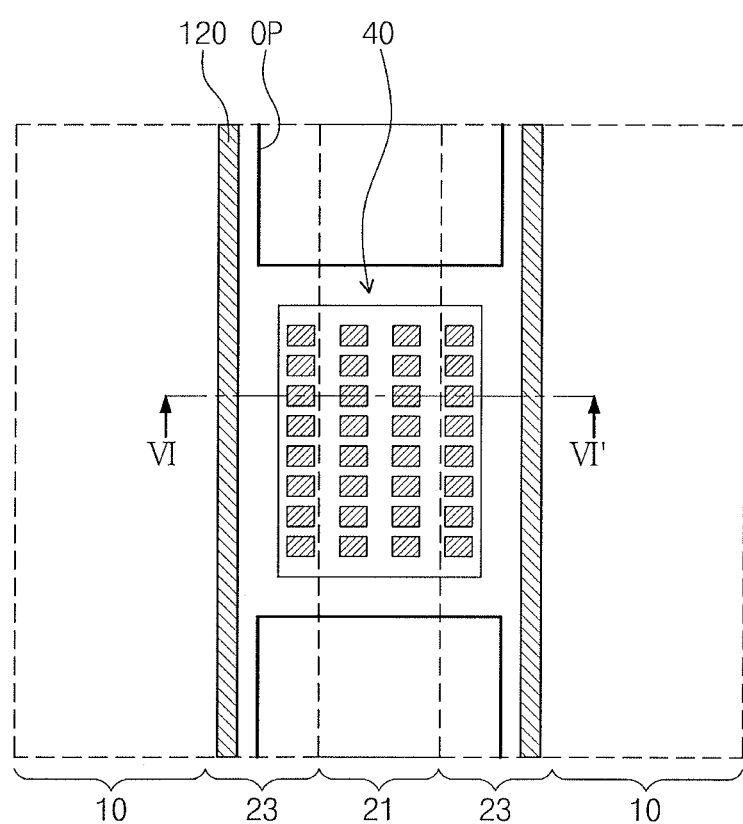
FIG. 16 illustrates an enlarged plan view of a portion of a semiconductor device according to an embodiment.
Figure 17A:
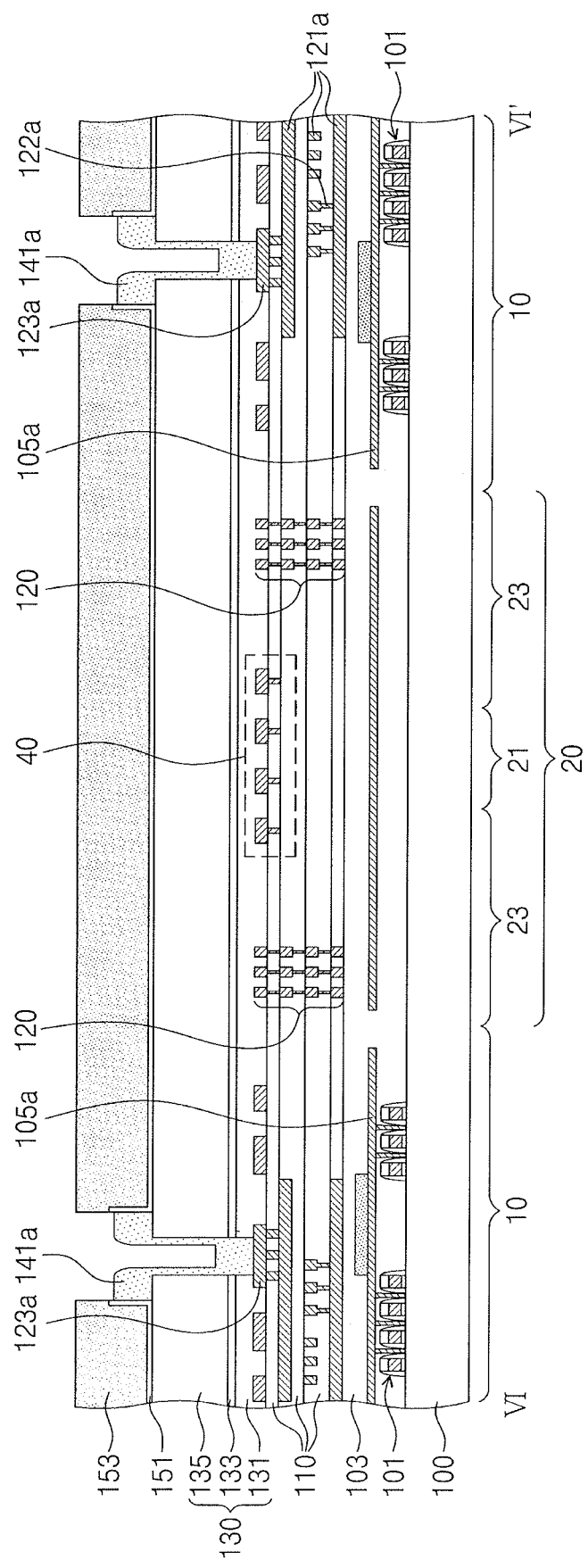
FIGS. 17A and 17B illustrate sectional views, which are taken along a line VI-VI' of FIG. 16, of a semiconductor device according to an embodiment, before and after a process of dividing semiconductor chips.
Figure 17B:
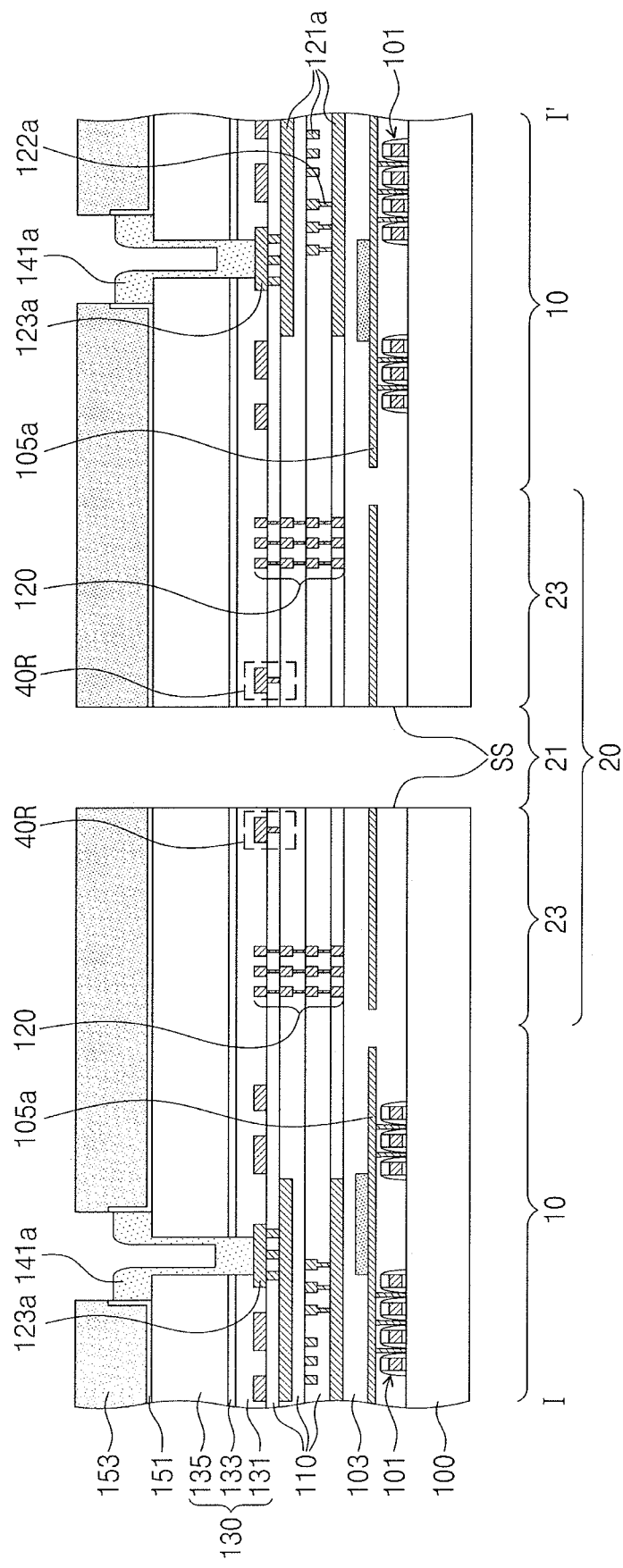

FIG. 16 is an enlarged plan view illustrating a portion of a semiconductor device according to an embodiment. FIGS. 17A and 17B are sectional views, which are taken along a line VI-VI' of FIG. 16 and illustrate vertical sections of a semiconductor device according to an embodiment, before and after a process of dividing semiconductor chips. Referring to FIGS. 16 and 17A, the process monitoring structure 40 may be provided on a portion of the scribe line region 20.

The process monitoring structure 40 may include process monitoring patterns on the lower insulating layer 110 and on the scribe line region 20. As an example, the process monitoring patterns may be formed during the formation of the chip pads 123a and may be located at substantially the same level as the chip pads 123a. As another example, the process monitoring patterns may be formed when the internal interconnection structures 121a and 122a are formed on the chip region 10.

On the scribe line region 20, the upper insulating layer 130 may cover the process monitoring structure 40 and may have a uniform thickness. A thickness of the upper insulating layer 130 on the process monitoring structure 40 may be substantially equal to that on the chip region 10.

Referring to FIG. 17B, the semiconductor substrate 100 may be cut along the scribe line region 20 to divide the semiconductor substrate 100 into a plurality of semiconductor chips, after the irradiation of the laser beam through the rear surface of the semiconductor substrate 100, as previously described with reference to FIGS. 5H and 5I. Here, portions 40R of the process monitoring structure may remain on the edge region 23. The upper insulating layer 130 may cover the remaining portions 40R of the process monitoring structure on the edge region 23 and may be formed to have a flat top surface.

FIGS. 18A to 18D are sectional views, which are taken along a line I-I' of FIG. 2 and illustrate stages in a method of fabricating a semiconductor device, according to an embodiment.

Figure 18A:
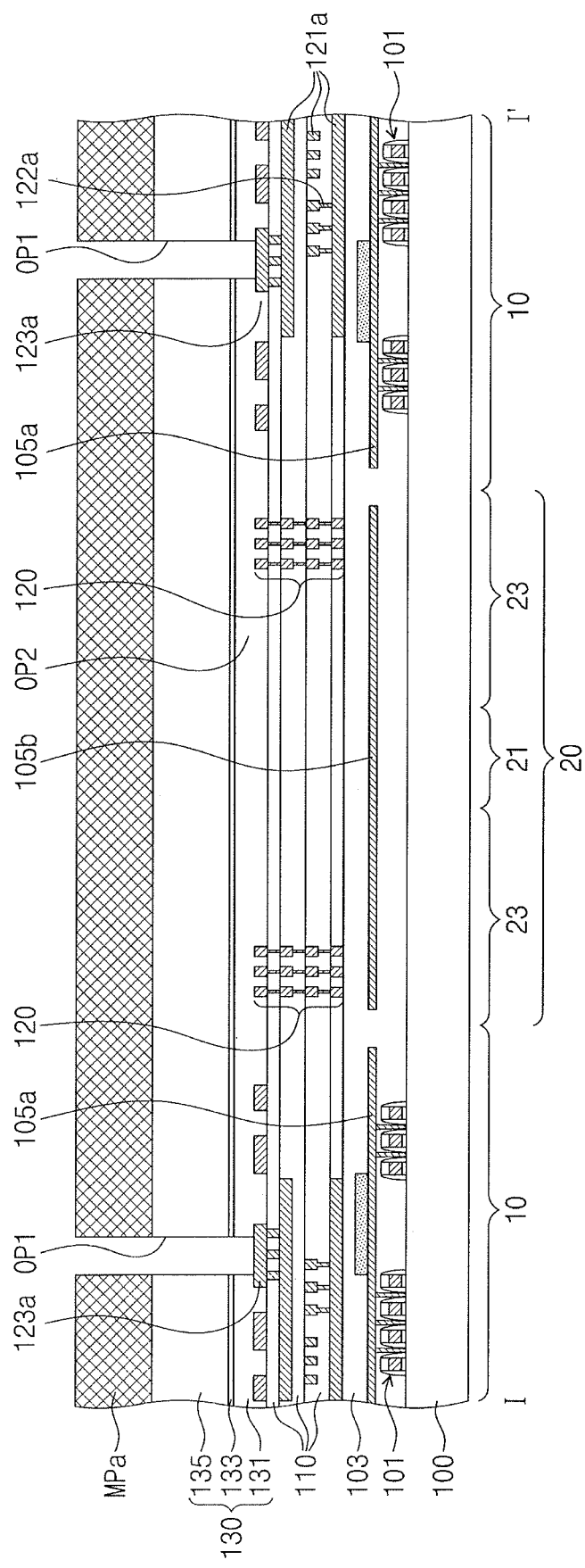
FIGS. 18A to 18D illustrate sectional views, which are taken along a line I-I' of FIG. 2, of stages in a method of fabricating a semiconductor device, according to an embodiment.

Referring to FIG. 18A, as described with reference to FIGS. 2 and 5A, the semiconductor integrated circuits 101 may be formed on the chip region 10 of the semiconductor substrate 100, and the test element groups and the process monitoring structures may be formed on the scribe line region 20.

The lower insulating layer 110 may be stacked on the interlayered insulating layer 103, and the internal interconnection structures 121a and 122a and the dam structure 120 may be formed in the lower insulating layer 110. Furthermore, dummy interconnection structures may also be formed in the lower insulating layer 110 on the scribe line region 20.

The upper insulating layer 130 may cover the entire top surface of the semiconductor substrate 100. For example, the upper insulating layer 130 may be formed on the uppermost layer of the lower insulating layer 110 to cover the chip pads 123a.

Thereafter, the first openings OP1 may be formed in the upper insulating layer 130 on the chip region 10. The formation of the first openings OP1 may include forming a first mask pattern MPa on the upper insulating layer 130 and anisotropically etching the upper insulating layer 130 to expose the chip pad 123a. When the first openings OP1 are formed, the first mask pattern MPa may cover the scribe line region 20. The first mask pattern MPa may be removed after the formation of the first openings OP1.

Figure 18B:
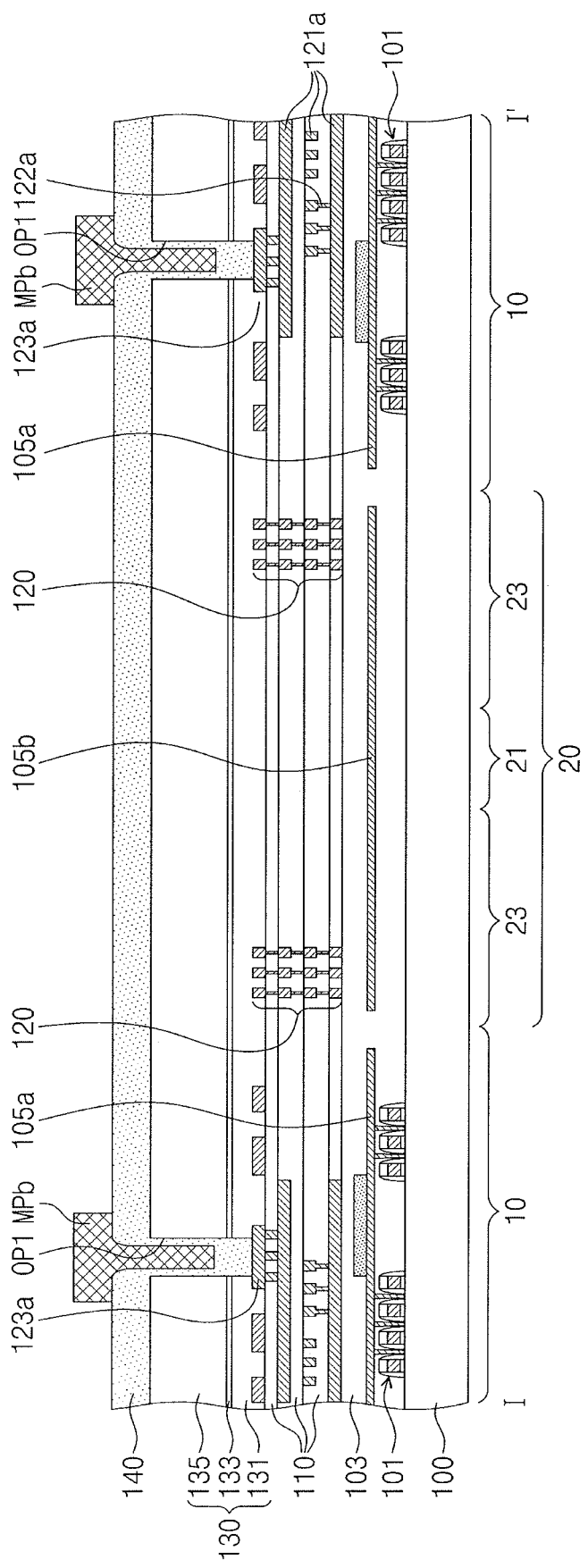

Referring to FIG. 18B, the re-distribution layer 140 may be formed on the upper insulating layer 130 with the first openings OP1. The re-distribution layer 140 may partially fill the first openings OP1 and thus the re-distribution layer 140 may be in contact with the chip pad 123a in the first openings OP1. The re-distribution layer 140 may have a uniform thickness on the top surface of the upper insulating layer 130.

The second mask pattern MPb may be formed on the re-distribution layer 140, after the formation of the re-distribution layer 140. The second mask pattern MPb may be locally formed on the chip pad 123a.

Figure 18C:
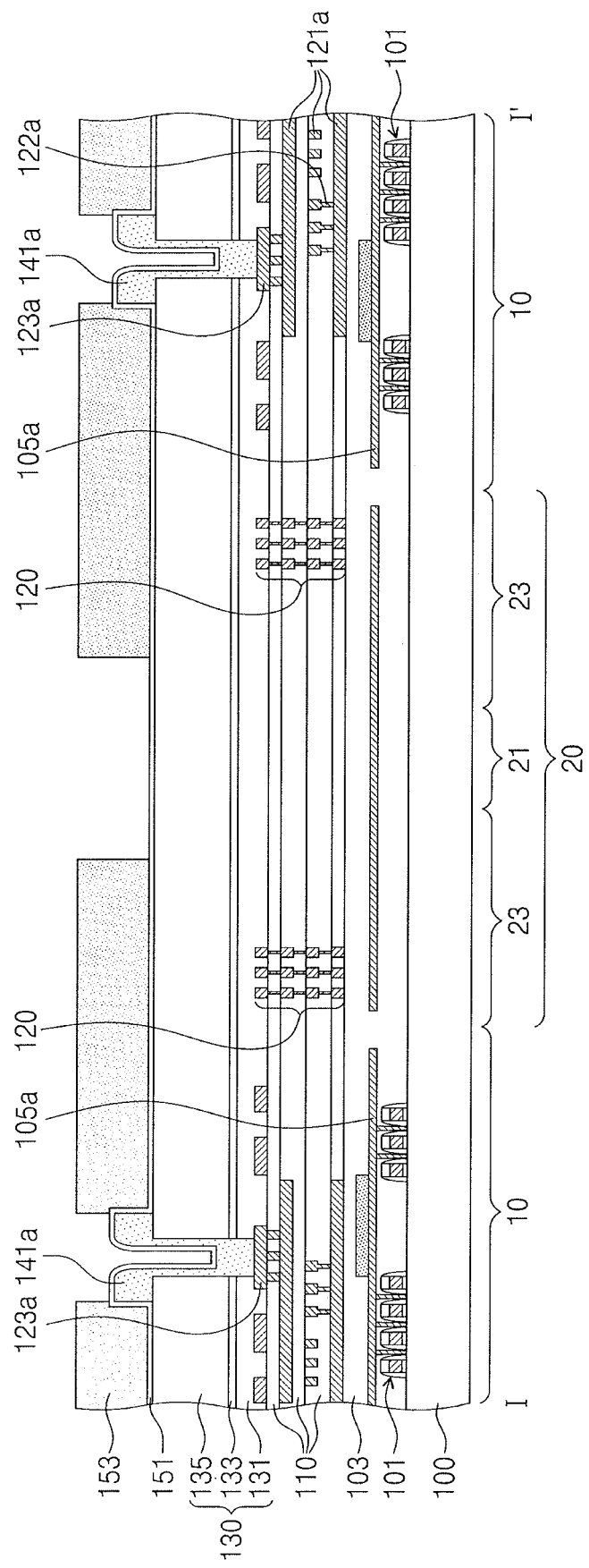

Next, the re-distribution layer 140 may be patterned using the second mask pattern MPb as an etch mask. For example, the re-distribution layer 140 exposed by the second mask pattern MPb may be etched to expose the upper insulating layer 130. As a result of the patterning of the re-distribution layer 140, the redistribution chip pads 141a may be respectively formed in the first openings OP1 on the chip region 10, as shown in FIG. 18C. The re-distribution layer 140 may be completely removed from the scribe line region 20 during forming the redistribution chip pads 141a on the chip region 10.

Thereafter, as shown in FIG. 18C, the passivation layer 153 may be formed on the upper insulating layer 130 to expose a portion of the redistribution chip pad 141a and a portion of the upper insulating layer 130 on the scribe line region 20. In certain embodiments, before the formation of the passivation layer 153, the protection layer 151 may be formed on the semiconductor substrate 100 to conformally cover the structure with the redistribution chip pad 141a.

When the protection layer 151 is formed, formation of the passivation layer 153 may include forming a passivation material using a coating process and patterning the passivation material using an exposure process, without forming an additional photoresist layer. Here, the patterning of the passivation material may be performed to expose a portion of the protection layer 151 on the redistribution chip pad 141a and a portion of the protection layer 151 on the scribe line region 20.

Figure 18D:
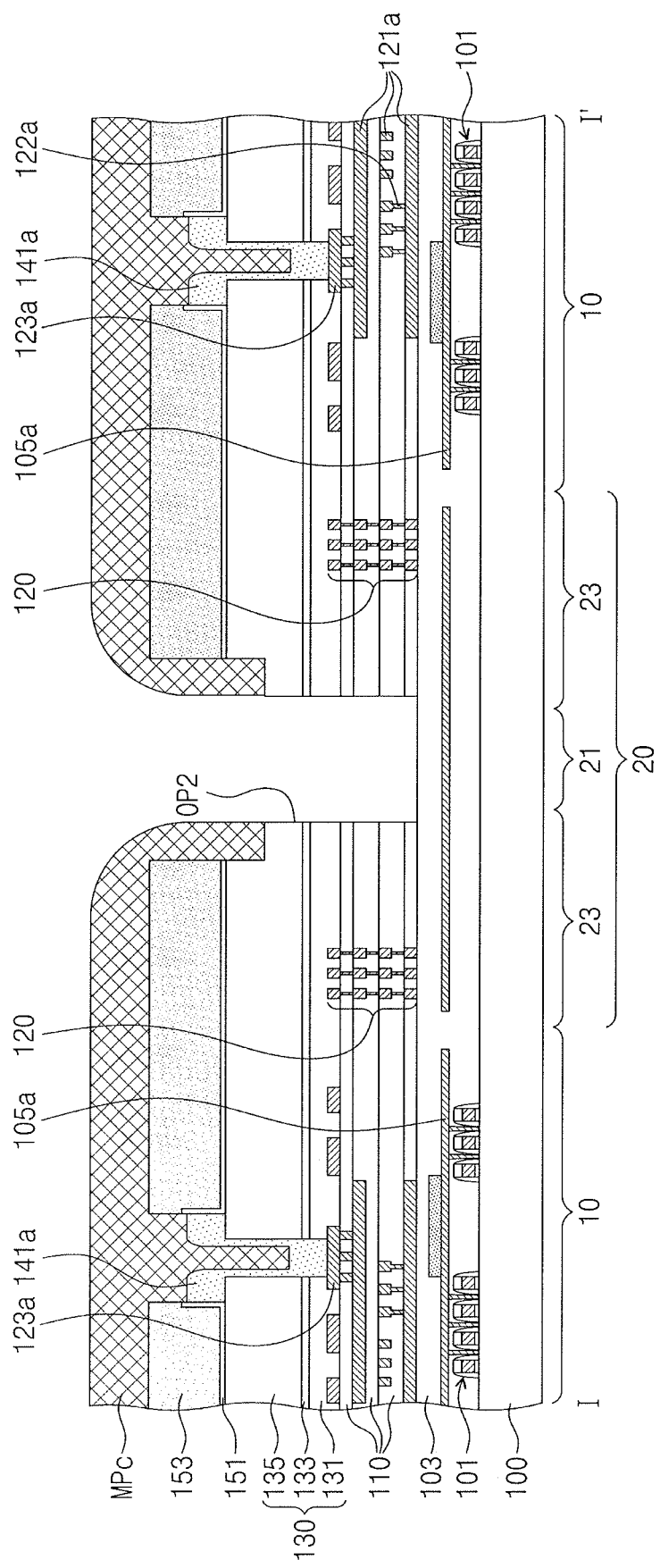

Next, as shown in FIG. 18D, the protection layer 151 exposed by the passivation layer 153 may be etched to expose the redistribution chip pad 141a. During this process, a portion of the protection layer 151 may be removed from the scribe line region 20 to expose a portion of the top surface of the upper insulating layer 130 on the scribe line region 20. Thus, the upper insulating layer 130 on the scribe line region 20 may be partially exposed or recessed.

Thereafter, a third mask pattern MPc may be formed on the passivation layer 153 to cover the chip region 10 and to expose a portion of the scribe line region 20. The third mask pattern MPc may cover the redistribution chip pads 141a and partially cover the recessed portion of the upper insulating layer 130 on the edge region 23.

The upper insulating layer 130 and the lower insulating layer 110 may be anisotropically etched using the third mask pattern MPc as an etch mask to form the second opening OP2 on the scribe line region 20. The second opening OP2 may have a substantially uniform width and expose the interlayered insulating layer 103.

As a result of the formation of the second opening OP2, the lower insulating layer 110 may be locally removed from the scribe line region 20. The third mask pattern MPc may be removed after the formation of the second opening OP2.

Thereafter, as described with reference to FIGS. 5H and 5I, the cutting process on the semiconductor substrate 100 may be performed along the cutting region 21. Since the lower and upper insulating layers 110 and 130 on the scribe line region 20 are partially removed before the cutting process, incomplete cutting, tearing of thin films, or forming of cracks toward the chip region during the separating process on the semiconductor substrate 100 may be prevented. In addition, since the re-distribution layer is completely removed from the scribe line region 20 before partially etching the lower and upper insulating layers 110 and 130 on the scribe line region 20, a metallic material of the re-distribution layer remaining on the edge region 23 after the cutting process may be prevented.

Figure 19A:
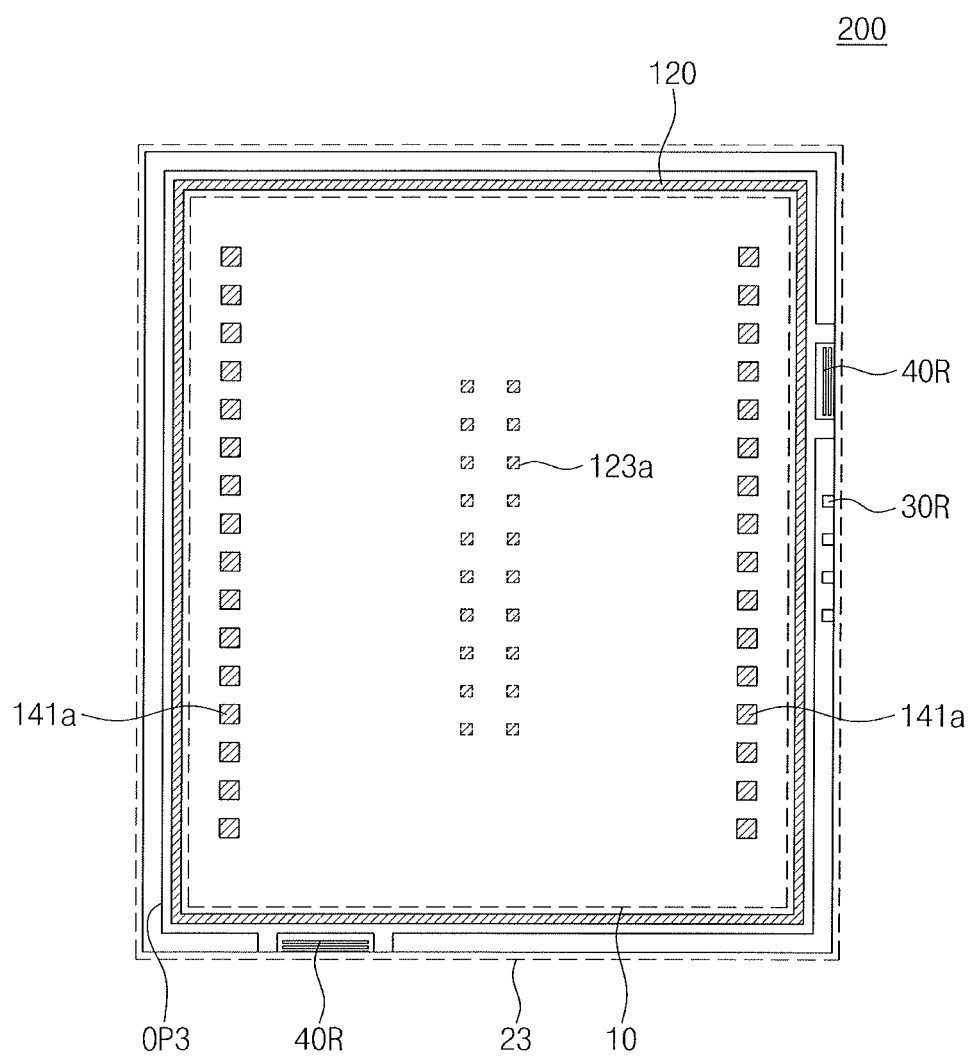
FIG. 19A illustrates a plan view of a semiconductor chip, which is a structure separated from a semiconductor device, according to an embodiment.
Figure 19B:
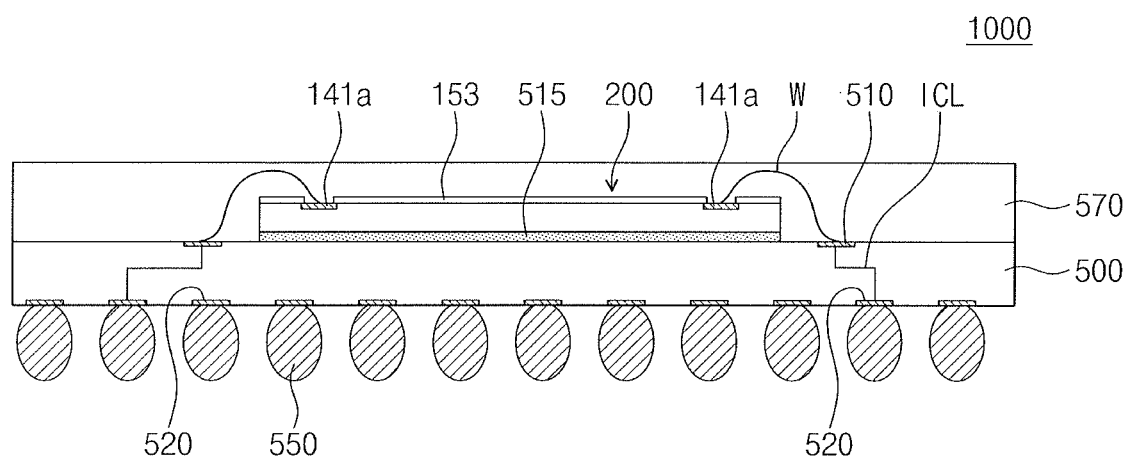
FIG. 19B illustrates a sectional view of a semiconductor package including a semiconductor chip according to an embodiment.

FIG. 19A is a plan view illustrating a semiconductor chip having been separated from a semiconductor device according to an embodiment. FIG. 19B is a sectional view illustrating a semiconductor package including a semiconductor chip according to an embodiment.

Referring to FIG. 19A, a semiconductor chip 200, which is divided by the cutting process on the semiconductor substrate 100, may include the chip region 10 and the edge region 23 around the chip region 10. Remaining test structures 30R and a remaining process monitoring structure 40R may remain in some portions of the edge region 23. A portion of the second opening of the upper insulating layer may remain in the edge region 23. In other words, the upper insulating layer may have a stepped structure in the edge region 23 of the semiconductor chip 200. The remaining process monitoring structure 40R may not overlap the second opening of the upper insulating layer, as described above.

Referring to FIG. 19B, a semiconductor package 1000 may include a semiconductor chip 200, a package substrate 500, outer coupling terminals 550, and a mold layer 570. In some embodiments, the semiconductor chip 200 may be fabricated by the afore-described method and may be mounted on the package substrate 500.

As described above, the semiconductor chip 200 may include the redistribution chip pads 141a exposed by the passivation layer 153. The redistribution chip pads 141a may include data pads for transferring data signals, command/address pads for transferring command signals and address signals, and power and ground pads applied with ground and power voltages, respectively.

The package substrate 500 may be, e.g., a printed circuit board, a flexible substrate, a tape substrate, or the like. In certain embodiments, the package substrate 500 may include a flexible or rigid printed circuit board, in which internal interconnection lines are provided, or a combination thereof.

The package substrate 500 may have top and bottom surfaces facing each other and may include bonding pads 510, internal interconnection lines ICL, and outer coupling pads 520. The bonding pads 510 may be arranged on a top surface of the package substrate 500, and the outer coupling pads 520 may be arranged on a bottom surface of the package substrate 500. The semiconductor chip 200 may be on a central region of the top surface of the package substrate 500, and an adhesive layer 515 may be provided between the semiconductor chip 200 and the package substrate 500.

The bonding pads 510 may be connected to the redistribution chip pads 141a of the semiconductor chip 200 through wires W. The outer coupling pads 520 may be connected to the bonding pads 510 through the internal interconnection lines ICL.

The mold layer 570 may be provided on the top surface of the package substrate 500 to cover the semiconductor chip 200. The mold layer 570 may be formed of or include an epoxy molding compound.

The outer coupling terminals 550 may be attached to the outer coupling pads 520, which are arranged on the bottom surface of the package substrate 500. The semiconductor package 1000 may be connected to an external electronic device through the outer coupling terminals 550.

According to some embodiments, lower and upper insulating layers on a scribe line region may be partially etched using a difference in material characteristics therebetween. Thus, it may be possible to prevent process failures (e.g., an incomplete cutting issue of a semiconductor substrate or a peeling or cracking issue in the lower and upper insulating layers) from occurring during a separating process on the semiconductor substrate. As a result, semiconductor chips, which are divided from the semiconductor substrate, may have improved reliability and yield.

Furthermore, a second opening having a rounded sidewall may be formed on the scribe line region, and then, a redistribution chip pads may be formed. Thus, a metallic material of a re-distribution layer may be prevented from remaining on the scribe line region. Accordingly, it may be possible to reduce a failure, which may occur in a process of packaging a separately divided semiconductor chip.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
a semiconductor substrate including a chip region and an edge region around the chip region;
a lower insulating layer on the semiconductor substrate;
a chip pad on the lower insulating layer on the chip region;
an upper insulating layer on the lower insulating layer, the upper insulating layer having a first opening exposing the chip pad on the chip region and a second opening exposing a portion of the lower insulating layer on the edge region; and
a redistribution chip pad connected to the chip pad, in the first opening,
wherein at least a portion of the second opening has a rounded sidewall, and at least part of the portion of the lower insulating layer exposed by the second opening has a rounded sidewall coextensive with the rounded sidewall of the second opening.

2. The semiconductor device as claimed in claim 1, wherein:
on the edge region, the upper insulating layer includes a first portion having a first thickness and a second portion having a decreasing thickness away from the chip region, and
on the chip region, the upper insulating layer has a second thickness greater than the first thickness.

3. The semiconductor device as claimed in claim 1, wherein, on the edge region, the lower insulating layer includes a first portion having a first thickness and a second portion having a second thickness less than the first thickness.

4. The semiconductor device as claimed in claim 3, wherein the second opening of the upper insulating layer exposes the second portion of the lower insulating layer.

5. The semiconductor device as claimed in claim 1, wherein:
the upper insulating layer includes sequentially stacked first, second, and third insulating layers,
the second insulating layer includes an insulating material different from the first and third insulating layers, and on the edge region, the third insulating layer has a stepped structure.

6. The semiconductor device as claimed in claim 1, wherein the lower insulating layer includes a dielectric material whose dielectric constant is lower than the upper insulating layer.

7. The semiconductor device as claimed in claim 1, further comprising a test structure on the edge region of the semiconductor substrate,
wherein the second opening of the upper insulating layer overlaps the test structure.

8. The semiconductor device as claimed in claim 1, further comprising a dummy metal pattern on the lower insulating layer and on the edge region,
wherein the second opening of the upper insulating layer exposes the dummy metal pattern.

9. The semiconductor device as claimed in claim 8, wherein the dummy metal pattern is placed at a same level as the chip pad.

10. The semiconductor device as claimed in claim 1, further comprising:
a test structure on the edge region of the semiconductor substrate; and
a redistribution test pad on the lower insulating layer on the edge region and connected to the test structure,
wherein the second opening exposes a portion of the redistribution test pad.

11. The semiconductor device as claimed in claim 1, further comprising a passivation layer on the upper insulating layer on the chip region to expose a portion of the redistribution chip pad and the rounded sidewall of the upper insulating layer.

12. The semiconductor device as claimed in claim 1, further comprising a process monitoring structure provided on a portion of the edge region,
wherein the upper insulating layer extends in the edge region to cover the process monitoring structure.

13. A semiconductor device, comprising:
a semiconductor substrate including a chip region and an edge region around the chip region;
a lower insulating layer on the semiconductor substrate;
a chip pad on the lower insulating layer on the chip region;
an upper insulating layer on the lower insulating layer to cover the chip pad, the upper insulating layer including an insulating material different from the lower insulating layer; and
a redistribution chip pad on the chip region to penetrate the upper insulating layer and to be connected to the chip pad,
wherein the upper insulating layer includes:
a first portion on a first part of the edge region and having a first thickness; and
a second portion on a second part of the edge region, the second portion extending from the first portion and having a second thickness smaller than the first thickness.

14. The semiconductor device as claimed in claim 13, further comprising a process monitoring structure provided on the first part of the edge region,
wherein the first portion of the upper insulating layer covers the process monitoring structure.

15. The semiconductor device as claimed in claim 13, wherein the upper insulating layer has a rounded sidewall on the edge region.

16. The semiconductor device as claimed in claim 13, wherein the upper insulating layer has a first inclined surface between the first and second portions.

17. The semiconductor device as claimed in claim 1, wherein a top surface of the upper insulating layer is at a lower level than a top surface of the redistribution chip pad.

18. The semiconductor device as claimed in claim 13, wherein a top surface of the first portion of the upper insulating layer is at a lower level than a top surface of the redistribution chip pad.

19. The semiconductor device as claimed in claim 13, further comprising a test structure on the edge region of the semiconductor substrate, the test structure overlapping the upper insulating layer.

20. A semiconductor device, comprising:

a semiconductor substrate including a chip region and an edge region around the chip region;

a lower insulating layer on the semiconductor substrate;

a chip pad on the lower insulating layer on the chip region;

an upper insulating layer on the lower insulating layer to cover the chip pad, the upper insulating layer including an insulating material different from the lower insulating layer; and a redistribution chip pad on the chip region to penetrate the upper insulating layer and to be connected to the chip pad, wherein the upper insulating layer includes:

a first portion on the chip region and having a first thickness;

a second portion on the edge region, the second portion extending from the first portion and having a second thickness smaller than the first thickness; and a third portion on the edge region, the third portion extending from the second portion, spaced apart from the first portion, and having a decreasing thickness away from the second portion, wherein the third portion of the upper insulating layer has a rounded sidewall, and wherein a top surface of the first portion of the upper insulating layer is at a lower level than a top surface of the redistribution chip pad.

\* \* \* \* \*